United States Patent [19]
Ishihara et al.

[11] Patent Number: 5,953,591
[45] Date of Patent: Sep. 14, 1999

[54] PROCESS FOR LASER DETECTION OF GAS AND CONTAMINANTS IN A WAFER TRANSPORT GAS TUNNEL

[75] Inventors: Yoshio Ishihara, Tsukuba; Masayuki Toda, Yonezawa; Tadahiro Ohmi, Sendai, all of Japan

[73] Assignee: Nippon Sanso Corporation

[21] Appl. No.: 08/894,497

[22] PCT Filed: Dec. 27, 1996

[86] PCT No.: PCT/JP96/03852

§ 371 Date: Jul. 29, 1997

§ 102(e) Date: Jul. 29, 1997

[87] PCT Pub. No.: WO97/24760

PCT Pub. Date: Jul. 10, 1997

[30] Foreign Application Priority Data

Dec. 28, 1995 [JP] Japan .................................. 7-344089
Jun. 13, 1996 [JP] Japan .................................. 8-152695

[51] Int. Cl.$^6$ .................................................. H01L 21/30
[52] U.S. Cl. .......................... 438/115; 356/437; 29/25.01
[58] Field of Search .......................... 438/115, FOR 370; 356/437; 29/25.01

[56] References Cited

U.S. PATENT DOCUMENTS

| | | |
|---|---|---|
| 5,160,843 | 11/1992 | Lehto . |
| 5,378,145 | 1/1995 | Ono et al. . |
| 5,636,035 | 6/1997 | Whittaker et al. . |
| 5,656,813 | 8/1997 | Moore et al. . |

FOREIGN PATENT DOCUMENTS

| | | |
|---|---|---|
| 4-184927 | 7/1992 | Japan . |
| 4-242952 | 8/1992 | Japan . |
| 5-99845 | 4/1993 | Japan . |
| 5-211225 | 8/1993 | Japan . |
| 6-37168 | 2/1994 | Japan . |
| 8-139156 | 5/1996 | Japan . |

OTHER PUBLICATIONS

T. Ohmi et al., *Breakthrough for Scientific Semiconductor Manufacturing in 2001*, pp. 27–29 and Panel 14 Date Not Available.

*Primary Examiner*—David E. Graybill
*Attorney, Agent, or Firm*—Darby & Darby

[57] ABSTRACT

A process of using a transport system for transporting substrate wafer, for making semiconductor integrated circuits and liquid crystal display panels and the like advanced devices, is presented. The object is to prevent surface degradation which may be inflicted on the surface to interfere with proper processing of the substrate. The substrate wafers are delivered to process chambers always in clean surface conditions. A method illustrated utilizes a purge gas containing an inert gas or a mixture of an inert gas and oxygen for flowing inside the tunnel space, and a semiconductor laser detection system to detect the contamination levels within the tunnel space, and the transport parameters are controlled according to the measured data.

13 Claims, 11 Drawing Sheets

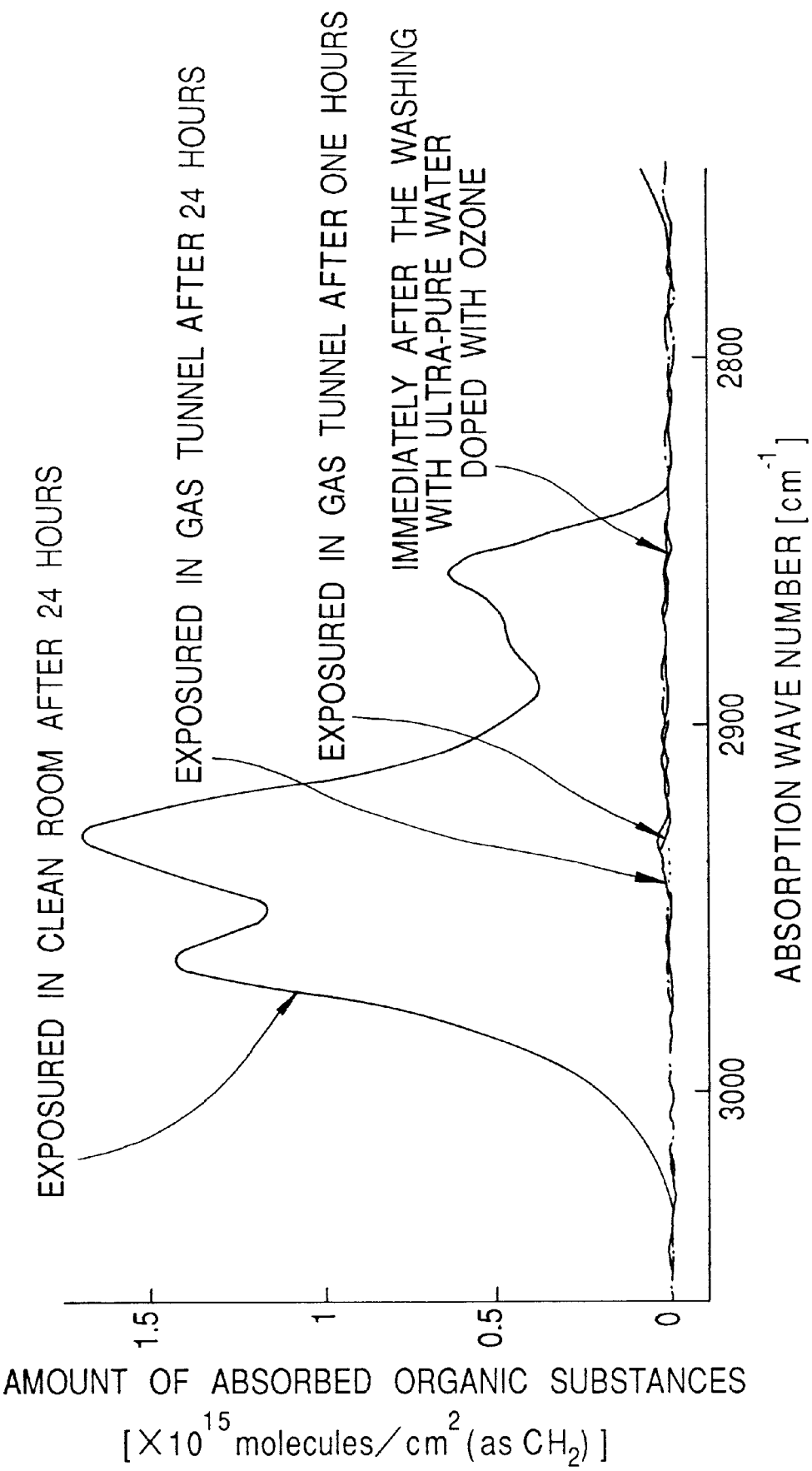

PROCESS FOR LASER DETECTION OF GAS AND CONTAMINANTS IN A WAFER TRANSPORT GAS TUNNEL

TECHNICAL FIELD

The present invention relates in general to transporting method and apparatus system for transporting substrate wafers used for manufacturing such advanced devices as semiconductor integrated circuits, liquid crystal panels and solar battery panels, and relates in particular to a method and apparatus to enable maintaining clean substrate surfaces while they are being transported to be processed.

BACKGROUND ART

Advanced device elements such as integrated circuits, semiconductor lasers, active matrix type liquid crystal display panels and solar battery panels are made by successive fabrication of specific film layers and the like on a highly cleaned surface of substrate materials such as silicon, gallium arsenide and glass.

Extreme precision is required for manufacturing of such device parts, and if the wafer materials to be processed are contaminated with adhesion or adsorption of even microscopic contaminating impurities, it becomes difficult to manufacture high quality products.

Further, such substrate wafers are susceptible to accumulating static charges during the processes of transport and various treatments, resulting in their attracting and holding contaminations from the surrounding atmosphere.

For example, if moisture as impurity is adhering to the surface of the semiconductor wafer, it will cause problems during the subsequent device processing. If there is excess moisture adhering to the surface, and the surrounding atmosphere contains a partial pressure of oxygen, a native oxide film is formed on the surface of the wafer, interfering with subsequent fabrication steps such as a deposition of a desired thin film.

Further, during the process of making thin film transistors (TFT) used in liquid crystal display panels, for example, if moisture is present on an electrically insulating film, such as $SiN_x$, it interferes with the process of forming a uniform and controlled thickness of amorphous silicon (a-Si) film.

Further, during the process of fabricating gate oxide films, for example, if moisture is present on the surface of an n- or p-region, a $SiO_x$ film is produced at the interface between a $SiO_2$ film and a Si substrate, and such a MOS transistor would not function as a proper switch. Similarly, in the process of fabricating capacitor electrodes, if moisture is present on the surface of a capacitor, a $SiO_x$ film is produced on its surface, and electrical charge storage capability of the capacitor is damaged, and its ability to function as a memory element is destroyed.

In metallization process, a titanium nitride (TiN) film is deposited before forming a tungsten film to prevent spikes caused by the presence of tungsten silicide, and if moisture is present on the Si substrate, the adherence of the interface between Si substrate and TiN is diminished.

Other contaminating substances other than water can also affect the device performance, for example, if heat treatment is carried out in the presence of organic impurities, such as methane, carbon can react with the surface of the silicon substrate to form a SiC film, and device performance is degraded.

For these reasons, various process chamber used in manufacturing of such integrated semiconductor devices are placed in clean rooms capable of filtering dust particles which are usually comprised of microparticles.

Integrated semiconductor circuits are produced after a series of successive fabrication steps, and therefore, the in-process substrate wafers are subjected to a number of processing steps in various process chamber, and are also subjected to a process of being transported from one processing line to another processing line.

During such transporting steps, the wafers are exposed to the atmosphere in the clean rooms which are usually kept at a temperature between 20–25° C., and a relative humidity of about 50%, and although microparticles are filtered out, many gaseous particles are still present. As a result, some impurities present in the clean room can be adsorbed on the surface of the wafers. For example, moisture present in the air atmosphere is instantly adsorbed on the substrate surface. To prevent such moisture adsorption, it is not a practical solution to remove moisture from all the clean rooms.

A proposal has therefore been made to transport the wafers from a process chamber to another process chamber while holding them in pockets, of a transport robotic device, filled with dry nitrogen. The disadvantage of this method is that transport process is lengthy and productivity is low.

There has been a proposal to connect one process chamber and another process chamber through a tunnel, which is filled with some inert gas such as nitrogen, and transport the wafers through the gas-filled tunnel (refer to Japanese Patent Application, First Publication, H5-211225).

Using this system, it becomes possible to transport the wafers from one process chamber to another process chamber without exposing the wafers to external atmospheres. Such a system also enables to utilize the power of flowing gas stream for transporting the wafers.

There has also been an improved version of the system disclosed above involving recycling of the inert transport gas in the tunnel, by treating it in a Cryogenic nitrogen generator (see, T. Ohmi et al., Breakthrough for Scientific Semiconductor Manufacturing in 2001, No. 21, 1992).

However, even in an apparently fool-proof system, it is unrealistic to expect that unanticipated entry of outside atmosphere or entry of outside atmosphere, through an accidental breakage in the tunnel, cannot occur. Even in an inert-gas filled tunnel, it is difficult to always filter out all the particles, particularly moisture particles, from the tunnel environment.

Therefore, if the moisture concentration or partial pressure of water in the inert gas tunnel atmosphere should rise for some reason, adsorption of water on the substrate wafer can take place, leading to the formation of a native oxidation film, a loss in production yield and a potentially serious revenue loss.

Also, if an accidental break should occur in the tunnel, the entire production lines must be stopped to examine the causes of failure and accident site, and to undertake repair work, leading to a prolonged downtime and production losses.

Furthermore, during such an accidental breakage in the tunnel, it should be considered that along with inflow of outside atmosphere into the tunnel, the inert gas atmosphere inside the tunnel would flow out of the tunnel. Should a large quantity of inert gas escape into the surrounding environment, it could lead to oxygen deficiency in the surrounding areas.

That was why there has been a proposal to run oxygen gas with inert gas previously in the inert gas tunnel, to prevent occurrence of oxygen deficiency even if there is an accident.

However, this action would promote the formation of native oxide films on the substrate surface.

Additionally, within the inert gas tunnel, there is a potential contamination from back streaming of process gases used in various process chamber, for example, $H_2O$, $CO_2$ and organic group gases such as $CH_4$ (shortened to H-C hereinbelow) which are potential contaminations to the wafers being transported in the inert gas tunnel.

Out of the background of such developments, a consideration has been given to an idea that a cleaning chamber for cleaning the surface of the wafers be placed between a process chamber and the tunnel in order to avoid producing rejects even if unwanted substances such as moisture are happen to be present within the tunnel. By having such a cleaning chamber, it can be ensured that the substrate surfaces can always be maintained clean and proper processing can be performed, even if moisture and other contaminations are adhered to the substrate surface, by carrying out certain cleaning steps before performance of the next processing line.

Such cleaning chambers may be based on high temperature heating (about 300° C.) of wafers to remove water adhering to the surface of the wafers. Other processes include removing of contaminations, water and native oxide film, by activating the substrate surface with plasma cleaning or ion cleaning.

However, the thermal technique is not recommended for TFT wafers because of possible shape distortion of the wafers, and this technique is not sufficient for removing native oxide films from the wafers, at such a low temperature of 300° C. If the heating temperature is lowered to avoid a heat distortion, the process of moisture removal becomes excessively lengthy or the results are inadequate.

The plasma cleaning and ion cleaning methods present not only the inherent problem that the surface cleanliness would be inadequate unless the energy or time of exposure is sufficient, but even more seriously, if such cleaning processes which are high power for the case of many adhered contaminations or formation of native oxide film, are applied to a surface which is already sufficiently clean, the substrate surface may become rough, and even more serious damage may be inflicted on the substrate surface.

DISCLOSURE OF INVENTION

It is an object of the present invention to provide a system of transporting substrate wafers and a method of operating the system to prevent degradation in the surface quality of the wafers during the transport process, by always maintaining the surfaces in a clean condition, while they are being transported to various process chambers, improving the production yield in advanced devices manufacturing.

The object has been achieved in a method for controlling a transport process of substrate wafers from one process chamber to another process chamber through a gas tunnel, comprising the steps of: flowing a purge gas containing an inert gas or a gaseous mixture of an inert gas and oxygen through the gas tunnel for controlling an atmosphere inside a tunnel space; measuring contamination levels within the tunnel space with semiconductor laser detection system through windows disposed on the gas tunnel; and adjusting transport parameters according to measured data.

According to this method, before the wafers are placed inside a process chamber, the contamination level inside the tunnel is measured, and the transport parameters are adjusted to always transport the wafers in conditions to maintain clean surfaces according to the measured data so that various processing can be carried out properly and the generation of defective products is minimized.

According to the present method, detection of contaminations is performed by a semiconductor laser detection system, so that there is no need to place the laser oscillator or laser detector inside the tunnel space to interfere with the transport process. The system is highly sensitive, and its response characteristics are excellent.

Adjustment of the oscillation wavelength of the laser beam can be carried out quite easily, and the detector can be tuned to specific contaminations, such as $H_2O$, $CH_4$, $SiH_4$ and $O_2$ for example, and the laser oscillator can be tuned to oscillate a laser beam in a wavelength range of 0.75–2 $\mu$m for scanning purposes, and a laser detector is used to determine absorption spectra of the gaseous contaminations, thus enabling to detect several contaminations.

Further aspect of the method is that, by measuring the scattered beam intensity, it is possible to determine a solid contamination level floating in the tunnel atmosphere.

Further aspect of the method is that the semiconductor laser detection system can identify a gaseous contamination separately from a solid contamination by synchronizing an absorption spectrum intensity to define a gaseous contamination with a scattering spectrum intensity to define a solid contamination.

A system to carry out the method described above can be achieved by having a semiconductor laser detection system comprising a laser oscillator; a laser detector; a scattered beam detector disposed at right angles to a beam axis joining the laser oscillator and the laser detector; and a reflector member disposed opposite to the scattered beam detector across the beam axis.

By controlling a flow rate of the purge gas flowing in the tunnel space according to the measurement data generated by the semiconductor laser detection system, contamination level can be reduced while consuming a minimum necessary quantity of purge gas.

Further, by using the measured contamination data to control routing of the wafers, even if problems develop in a local line, processing of the clean substrate wafers can be continued without shutting down the entire transport system.

Further, using a system in which the measured data are used to define a need for placing the substrate wafers in a cleaning chamber disposed in a fore-stage of a process chamber, uncontaminated wafers are always directed to the process chamber without applying a cleaning step, while contaminated wafers are directed to the cleaning chamber to be suitably cleaned, so that, at all times, only the process ready wafers are transported to the process chamber. Also, because the clean wafers are not directed to the cleaning chamber, the system enables to avoid unnecessarily inflicting surface damage to clean wafers.

Further in a system utilizing the measured data to control the operation of the cleaning chamber, an appropriate cleaning process, to suit the level of contamination of the wafer surface, is chosen so that a suitable type and level of cleanliness are provided to the wafers, so that a desired processing can be applied to the surface, without unnecessary surface damage.

In another system for transporting substrate wafers, various control methods disclosed above are combined so that, by controlling the flow rate of purge gas on the basis of the measurement data generated by the semiconductor laser detection system, the contamination level inside the tunnel space can be maintained low, and even if the level should increase beyond a given level, by altering the transport routing, the contact with the contaminations can be avoided or by providing a suitable cleaning process to the wafers so that wafers having a sufficient clean surface and free from damage can always be supplied to the process chamber.

In the system presented above, it is desirable that the gas composition for the transporting is same as the gas composition for the purging in order to avoid the problems of contaminations adhering to the surface.

Also, in consideration of a possible breakdown in the transport system to give an oxygen-deficient environment, it is desirable to use a gaseous purge mixture containing an inert gas and added oxygen. In such a system, it is preferable to measure the oxygen concentration inside the tunnel space with a semiconductor laser detection system so as to enable monitoring and measuring the oxygen level inside the tunnel space. In such a system, it is desirable to control at least one of either the inert gas or the oxygen content in the tunnel space in accordance with measured data by said semiconductor laser detection system.

Further, it is possible to judge whether a native oxide film has been formed or moisture adsorption has taken place on the wafer surface, by knowing the transport duration in the tunnel space, type of the wafer and the partial pressure of water. In such a system, in accordance with the judgement those wafers which can be processed without cleaning can be placed in a process chamber immediately, and those needing cleaning can be cleaned by applying a cleaning procedure appropriate to the level of native oxide film formed on the wafer surface, so that the wafers transported inside the process chamber will always have a suitable level of cleaning appropriate to the process to be applied, and avoiding an unnecessary surface damage caused by applying an excessively severe cleaning process.

In such a system, it is desirable to maintain the level of moisture to be less than 0.1 ppm, and/or the partial pressure of water inside the gas space to be less than 0.1 Pa.

A system for transporting substrate wafers may comprise: a plurality of process chambers for providing processing to the substrate wafers; a gas tunnel communicating the plurality of process chambers for transporting the substrate wafers and for flowing a purge gas through a tunnel space; a semiconductor laser detection system disposed on exterior of the gas tunnel for determining contamination levels within the tunnel space; so that (1) the flow rate of purge gas inside the tunnel space can be controlled in accordance with the measurement data generated by the semiconductor laser detection system; or (2) the transport routing for substrate wafers is controlled in accordance with measurement data generated by the semiconductor laser detection system; or (3) the wafers may be cleaned in a cleaning chamber disposed between a process chamber and the tunnel space in accordance with measurement data generated by the semiconductor laser detection system.

Further, to supply gaseous oxygen to the tunnel space, a transporting system may comprise: a plurality of process chambers for providing processing to the substrate wafers; a gas tunnel communicating the plurality of process chambers for transporting the substrate wafers and for flowing a purge gas added oxygen gas through the tunnel space; a semiconductor laser detection system disposed on exterior of the gas tunnel for determining oxygen levels within the tunnel space; so that at least one of flow rates of an oxygen gas and an inert gas is controlled in accordance with measured data generated by the semiconductor laser detection system.

Further, it is suitable to utilize a transporting system comprising: a plurality of process chambers for providing processing to the substrate wafers; a gas tunnel communicating the plurality of process chambers for transporting the substrate wafers and for flowing a purge gas through a tunnel space; a semiconductor laser detection system disposed on exterior of the gas tunnel for determining contamination levels within the tunnel space; and a pressure gauge for measuring a pressure within the tunnel space; and a cleaning chamber disposed between a process chamber and the gas tunnel for cleaning said substrate wafers; wherein the cleaning chamber is controlled in accordance with measured data generated by the semiconductor laser detection system and the pressure gauge.

BRIEF DESCRIPTION OF DRAWINGS

FIG. 13 is a graph showing the time dependent process adsorption of organic contaminations in a controlled gas atmosphere.

BEST MODE FOR CARRYING OUT THE INVENTION

In the present invention, the substrate wafers are transported through a gas tunnel wherein a purge gas flows, from one process chamber to another process chamber in a manufacturing line having a several process chambers providing separate processes to the same group of wafers.

The gas tunnel is a hermetic structure, preventing an exterior atmosphere from seeping into the tunnel space, and lowering the opportunities for various contaminations to contact the substrate surfaces by excluding the exterior atmosphere.

The purge gas is a filtered inert gas which has been processed to remove microparticles and moisture, and which does not react with the wafer material, for example, gaseous nitrogen, argon or helium.

Also, purge gas contains oxygen added to an inert gas, so as to prevent the oxygen deficient environment, should a breakage occur in the gas tunnel.

Various methods for transporting substrate wafers are known in the art, for example, a Japanese Patent Application, Second Publication, S55-38828 or a Japanese Patent Application, First Publication, H5-211225.

The method disclosed in a Japanese Patent Application, Second Publication, S55-38828 is based on channels formed on the tracks for transporting the wafers, and a gas is ejected along the channels to propel the wafers.

Figure 3:
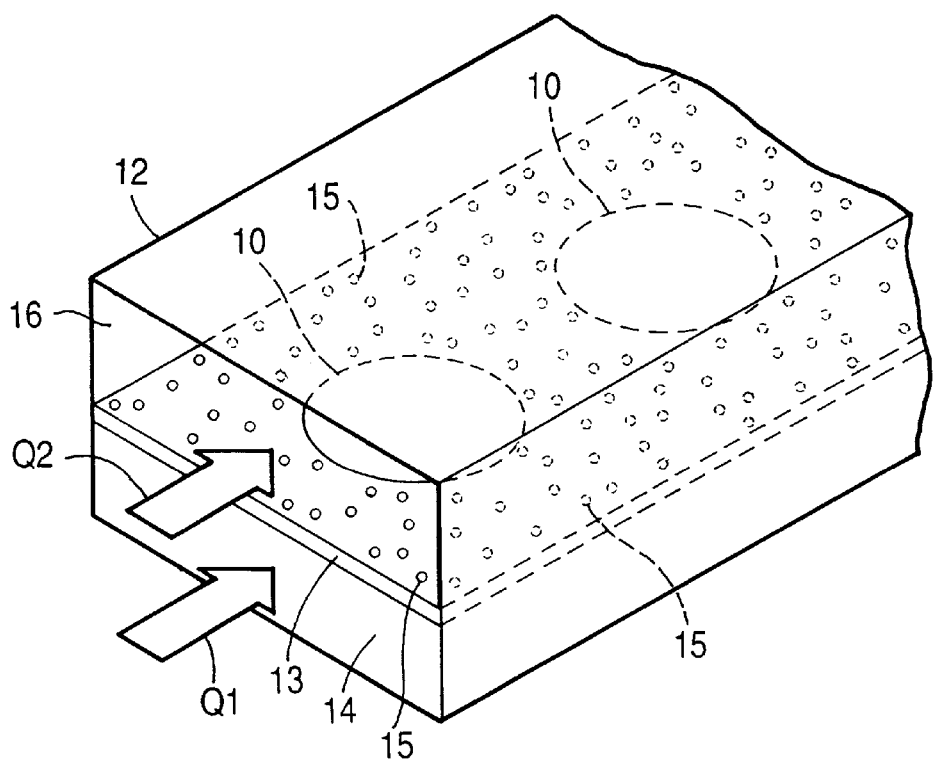
FIG. 3 is a partial perspective view of an example of the gas tunnel for transporting substrate wafers by the flowing movement of a transport gas.

The method disclosed in a Japanese Patent Application, First Publication, H5-211225 is based on a dual passage structure, as shown in FIG. 3, formed by a dividing plate 13 to divide the tunnel space into upper and lower passages in which the lower passage 14 below the dividing plate 13 is used to flow a transport gas which floats the substrate wafers 10, and the upper passage 16 above the dividing plate 13 is used for purge gas to keep the wafers free of contaminations. The transport gas flows from the lower passage 14, through numerous jet holes 15 in the dividing plate 13, and enters into the upper passage 16, where it floats the wafers 10 and transport them through the upper passage 16.

The transport device for moving the wafers 10 in the tunnel is not restricted to such a gas-driven system, but other systems based on such methods as belt conveyor, magnetic or ultrasonic means, are suitable.

In the present invent ion, a semiconductor laser detection system is utilized in conjunction with the tunnel to measure the concentrations of contaminations and/or oxygen. The semiconductor laser detection system comprises at least a laser oscillator which oscillates a laser beam having an output wavelength in the infrared region; and a laser detector to receive the laser beam to determine the absorption spectra of the input laser beam.

The laser oscillator and the laser detector are not particularly limiting so long as they can, respectively, oscillate and receive a required wavelength as described below. The one used in the present invention is a variable wavelength laser, and it was found that a distributed feedback (DFB) semiconductor laser in the InGaAsP system is suitable. The DFB semiconductor laser has its diffraction grating within the current injection region, and is a single-mode laser oscillator, and therefore, does not require an optical filter such as a monochromator, and the optical power loss is also small, and can be made into a compact unit. Similarly, a Distributed Bragg Reflection (DBR) laser which has its diffraction grating outside the current injection region and is a single-mode laser oscillator is also suitable.

Suitable laser detectors are those that are sensitive to the output wavelength from the laser oscillator, for example, a solid element laser detector based on Ge or InGaAs.

Using such a semiconductor laser detection system, it is possible to measure the concentrations of contaminations or oxygen in the tunnel space, by providing a window section which transmits the laser beam at the tunnel and placing the laser oscillator and laser detector appropriately in the window section. This arrangement eliminates the need to install the laser detection system in the interior of the tunnel, so that there is no interference with the substrate transport process. This semiconductor laser detection system can detect a very small amount of contaminations (0.1 ppm level). Also, the adjustments of output wavelength and optical axis to be carried out are easy.

A detection technique based on analyzers such as gas chromatography is time consuming for obtaining results, but the present method based on determining the absorption spectra of a semiconductor laser beam enables to produce an instantaneous result of measurements of concentrations of contaminations and/or oxygen. Therefore, semiconductor laser beam system is suitable for use in feedback control of the process.

For the detection of $H_2O$ as a contamination in the tunnel space, an output wavelength region in a range of 1.35–1.42 $\mu$m is suitable. Similarly, an output wavelength should be between 1.43–1.46 $\mu$m for $CO_2$, between 1.29–1.50 $\mu$m for $CH_4$, between 1.19–2.00 $\mu$m for $SiH_4$, between 1.25–1.35 $\mu$m for HF, between 1.34–1.37 $\mu$m for HBr and between 0.75–0.78 $\mu$m for $O_2$.

It follows that, by successively scanning a range of wavelengths from 0.75–2.0 $\mu$m, to correspond with the various target contaminations, not only the concentration of oxygen but those of other contaminations such as $H_2O$, $CO_2$, $CH_4$, $SiH_4$, HF and HBr and others can be determined.

Quantitative determination of contaminations and/or oxygen using a semiconductor laser is presented in various known art, for example, a Japanese Patent Application, First Publication, H5-99845 can be used. The simple technique consist of measuring the absorption spectra and subtracting the absorption spectrum corresponding to the gas spectrum of the inert gas (e.g., nitrogen) inside the tunnel so as to define and identify the peaks corresponding to contaminations and oxygen, and determine their concentrations from the values of the absorption intensity of selected absorption peak wherein there is little interfering peak nearby.

Scanning wavelengths can be done readily by adjusting the injection current or temperature of the laser oscillator.

Figure 4:
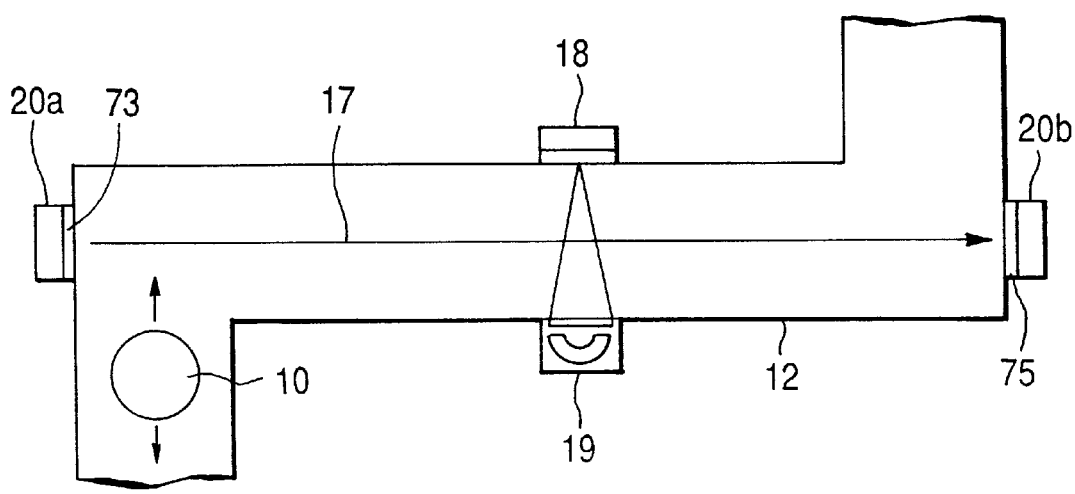
FIG. 4 is a plan view of a configuration of a semiconductor laser detection system.

Also, it is possible to determine the concentration of floating solid particles inside the tunnel by measuring a scattered beam intensity of the laser beam oscillated. To measure the concentration of the floating contamination particles simultaneously with measurements of the gaseous contaminations, a semiconductor laser arrangement, comprising a laser oscillator and scattered beam detector, as shown in FIG. 4 is suitable. In this example, a gas tunnel 12 to transport substrate wafers 10 is provided with a laser oscillator 20*a* disposed about a window section 73 oscillating a laser beam 17, and the laser beam 17 is detected by a laser detector 20*b* disposed about a window section 75. The laser oscillator 20*a* and the laser detector 20*b* are connected to an spectrometer controller (not shown), and the contamination concentrations in the tunnel space is computed from the measured values of the spectral intensity by the spectrometer controller. Also, a scattered beam detector 18 is disposed on an axis at right angles to the beam axis of the laser beam 17, and a spherical reflector member 19, comprising mirrors and the like, is disposed across the beam axis, opposite to the scattered beam detector 18. The scattered beam detector 18 and the reflector member 19 are also connected to the scattered beam controller (not shown) which computes the number and the particle size of the solid contaminations present in the tunnel space of the gas tunnel 12 from the measured value of the scattered beam intensity. It should be mentioned that the spectrometer controller and the scattered beam controller can be separate units or a shared unit.

This arrangement enables to determine the concentration of the gaseous contaminations by measuring the absorption spectral intensity of the laser beam with the laser detector 20*b* while determining the concentration of the solid contaminations by measuring the scattered beam intensity of the laser beam with the scattered beam detector 18.

The output wavelength range of the laser beam of 0.75–0.78 $\mu$m is suitable for determining the concentration of the solid contaminations from the measurements of the scattered beam intensity, and the same wavelength ranges used in scanning for various gas contaminations, mentioned previously, can be used satisfactorily.

Furthermore, by synchronizing the scanning process over a range of wavelengths, for both absorption spectra intensity for the measurements of the gaseous contaminations and scattered beam intensity for the measurements of the solid contaminations, It is possible to identify solid contaminations separately from the gaseous contaminations.

Figure 5:
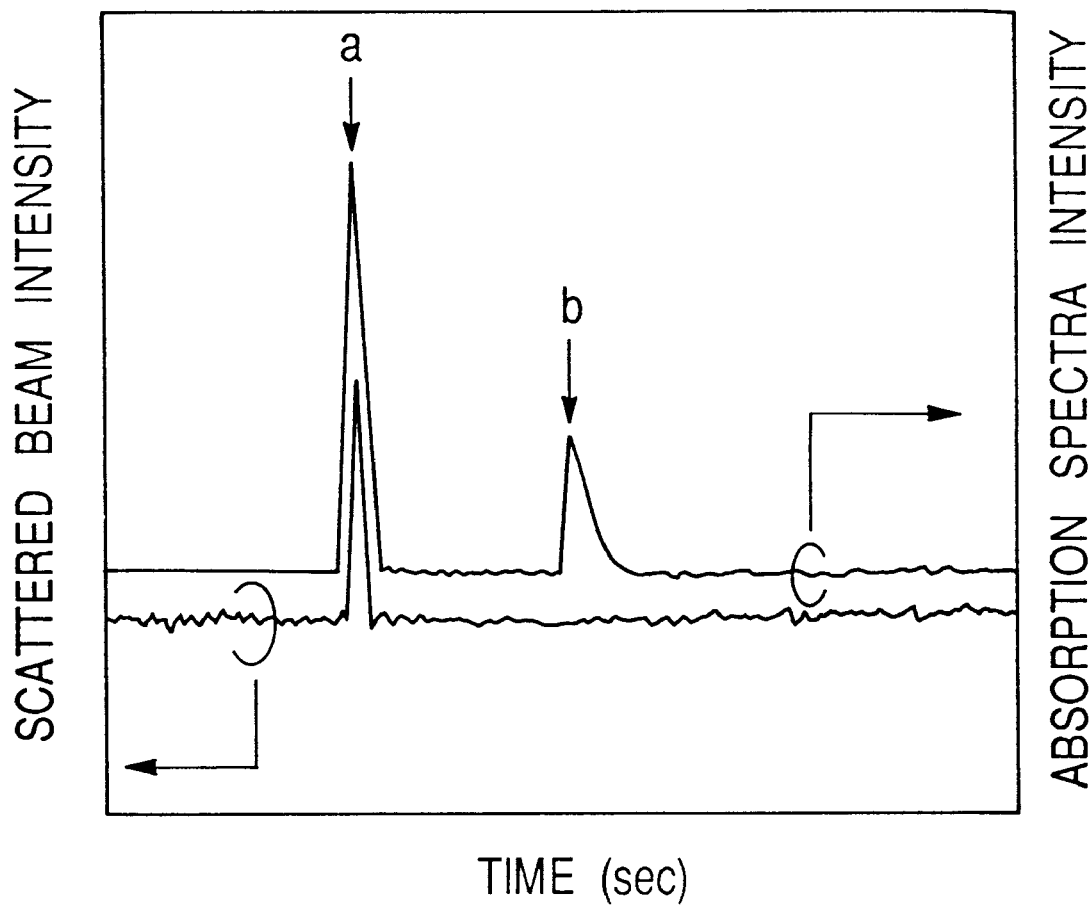
FIG. 5 is a graph showing the variations of the absorption spectral intensities and scattered light intensities.

FIG. 5 shows the results obtained by synchronizing the measurement processes for absorption spectra intensity and the scattered beam intensity. The horizontal axis represents time in seconds and the vertical axis represents the intensity of absorption spectra or scattered beam in appropriate units.

In this example, the scanning wavelength of the laser beam is fixed at 0.761 μm, so that the concentrations of oxygen is measured by the absorption spectra intensity and of the solid contaminations by the scattered beam intensity.

In FIG. 5, at point "a", peaks are present in both curves of absorption spectral intensity and the scattered beam intensity, indicating that some solid contaminations are present to have caused scattering of the laser beam. In this case, the peak in the absorption spectral intensity curve was observed by an amount equal to the scattered beam, which reduced the beam intensity arriving at the laser detector. In contrast, at point "b", there was no change in the scattered beam intensity, and the peak was present only in the absorption spectral intensity curve. This result indicated a high concentration of oxygen at this point "b". As described, by synchronizing the measurements of scattered beam intensity curve and the absorption spectral intensity, it Is possible to identify the presence of solid contaminations separately from the gaseous contaminations.

The size of the solid contaminations alters the scattered beam intensity, for a fixed value of laser beam intensity, so that the size can be determined from the measurements of the scattered beam intensity.

In the present invention, in order to transport the substrate wafers in a highly clean condition to each process chamber, at all times, the transport process is controlled on the basis of the contamination and oxygen concentration data output from the semiconductor laser detection system.

An example of the substrate transport method is to control the flow volume of the purge gas flowing in the tunnel space, on the basis of the data obtained from the contamination concentration data in the tunnel space mentioned above.

At low rates of flow of the clean purge gas inside the tunnel space, there is a danger of increasing the contamination quantity, and conversely, increasing the flow rate enables the quantity of contaminations to be lowered.

However, if the flow rate is constantly set above the volume required to transport the wafers, although the contamination concentration can be maintained low, the volume of the purge gas which must be treated as well as the load on the compressor are increased, and such an operation is uneconomic and undesirable.

However, by constantly monitoring the contamination concentration within the tunnel space, and appropriately controlling the flow rates of the purge gas in accordance with the actual contamination level, it is possible to not only prevent an increase in the contamination level and their adhering to the substrate wafer but also to carry out an economical production operation by using the minimum possible quantity of purge gas required to transport the wafers without unnecessary amount of flowing purge gas.

When admitting oxygen into the tunnel space, it is desirable to control the quantity of oxygen addition or inert gas, on the basis of the oxygen concentration data measured according to the procedure presented above.

When the oxygen concentration in the flowing purge gas inside the tunnel space becomes lower than 18 volume percent (v/o), there is a possibility of a large amount of gas containing low oxygen leaking out to the environment, should a break occur in the tunnel. If this occurs during the maintenance period, the maintenance worker is exposed to difficulties. On the other hand, if the oxygen concentration inside the tunnel space becomes higher than 22 v/o, there is a danger that small static spark could set off a fire. Especially, inside the tunnel space where the humidity is low, static electricity is apt to be generated by friction between the gas molecules and the tunnel walls. To remove the static charges, corona discharge technique is sometimes used, but in an environment where the oxygen concentration is higher than 22 v/o, this technique cannot be used. However, by adjusting the amount of oxygen addition or inert gas to the purge gas according to the amount of oxygen present in the tunnel space, it is possible to eliminate the cost and the facilities required to effectively deal with possible oxygen-deficiency situations, and to prevent the potential danger of fire caused by static charges. Further, to control the oxygen concentration, the flow volume of the inert gas as well as the volume of oxygen addition, there is no need to flow unnecessarily large volumes of purge gas, thus allowing to use the minimum necessary amount of purge gas and to improve the economy of the production process.

When the contamination is water, it is desirable to maintain its concentration below 0.1 ppm. By keeping the moisture level inside the tunnel space at less than 0.1 ppm, the formation of native oxide film on the substrate surface can be prevented.

The reduction in the moisture level to less than 0.1 ppm can also be done by controlling the flow volume of purge gas.

For a system using a transport gas and a purge gas as described above, the level of contaminations determined in the upper passage 16 is measured to control the flow rate of the purge gas.

Designating a flow rate of the transport gas by $Q_1$ (cc/s), a flow rate of purge gas by $Q_2$ (cc/s), a moisture removal velocity inside the tunnel space by V (cc/s), a moisture concentration at the inlet of the gas tunnel by $C_1$, a moisture level at the outlet of the tunnel by $C_2$, where $C_1 << C_2$, the following relation can be established.

$$C_2 = (C_1 \cdot Q_1 + C_1 \cdot Q_2 + V)/(Q_1 + Q_2)$$

In the above relation, $C_1$ and V are constants and $Q_1$ is determined by the transport conditions, therefore, to reduce $C_2$, it is necessary to adjust $Q_2$.

For example, when $C_1$ is 10 ppb, V is 0.5 cc/s, $Q_1$ is $2.8 \times 10^6$ cc/s, $Q_2$ must be adjusted to be higher than 9920 m³/h to reduce the moisture concentration $C_2$ below 0.1 ppm. Incidentally, when the purge gas flow rate $Q_2$ is zero, the moisture concentration $C_2$ is 0.19 ppm, and such high moisture concentration is apt to promote a moisture adhesion on the substrate surface and the growth of native oxide film.

It is also desirable to provide some evacuation openings communicating with an exhaust pump on the tunnel so that at least the gases around the evacuation openings can be extracted. Such evacuation openings enable to quickly remove locally generated high concentrations of contaminations by operating a vacuum pump connected to such evacuation openings, should such an even occur inside the tunnel space.

By combining this techniques of exhausting local contaminations with increasing the flow rate of purge gas, it is possible to eliminate contaminations from the tunnel space almost instantaneously.

Another embodiment of the control modes, for transporting substrate wafers inside a gas tunnel, is to provide an alternative route for transportation. In the conventional systems, when processing problems develop inside a process chamber caused by contaminations adhering to the wafer surface, for example, it has been necessary to shut down the entire transport system.

According to the present embodiment of the invention, there is no need to shut down the entire system, by preventing the wafers from passing through only the offending local region, so that the wafers in sound environmental regions can be continued to be processed normally.

Figure 6:
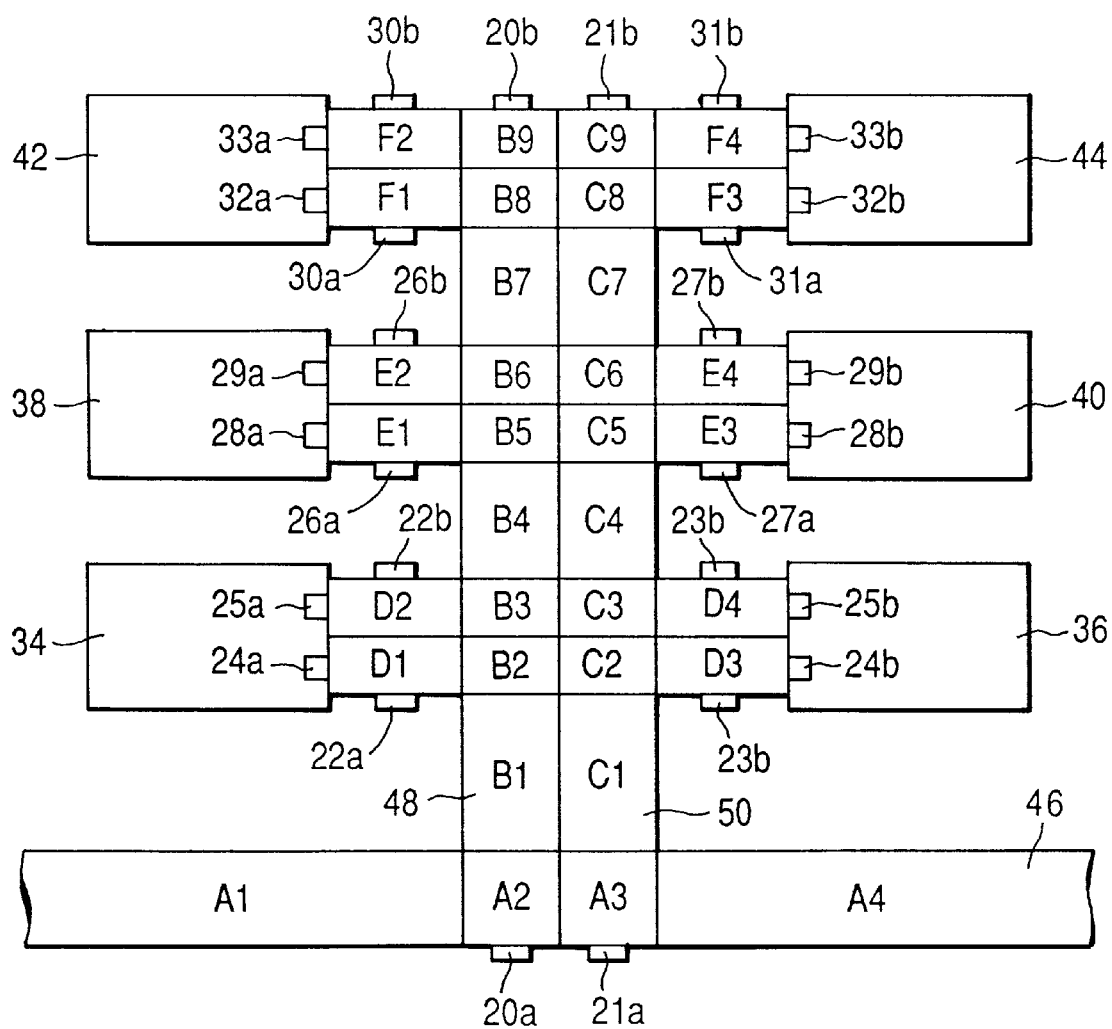
FIG. 6 is an example of the configuration of the transport route.

For example, FIG. 6 shows an example of such a routing scheme. In FIG. 6 the mainline 46 consists of blocks A1-A2-A3 and A4. A subline 48, branching out from the mainline 46, consists of blocks B1-B2-B3-B4-B5-B6-B7-B8 and B9. Similarly, a subline 50 consists of blocks C1-C2-C3-C4-C5-C6-C7-C8 and C9. From the subline 48, branch lines D1, D2, E1, E2, F1, F2 are provided, and from the subline 50, branch lines D3, D4, E3, E4, F3, F4 are provided. Additionally, interchangeable process chambers 34, 36, 38, 40, 42 and 44 are provided for providing the same process to all of the wafers which are directed thereto. Process chamber 34 is connected to the branch lines D1, D2; process chamber 36 to branch lines D3, D4, process chamber 38 to branch lines E1 E2, process chamber 40 to branch lines E3, E4, process chamber 42 to branch lines F1, F2 and process chamber 44 to branch lines F3, F4.

In addition, there is provided a semiconductor laser detection system comprising, a laser oscillator 20a in block A2 and a laser detector 20b for receiving laser beams oscillated from a laser oscillator 20a in block B9. Similarly provided are: a laser detection system comprising, a laser oscillator 21a in block A3 and a laser detector 21b to work with a laser oscillator 21a in block C9; a laser detection system comprising a laser oscillator 22a in block D1 and a laser detector 22b to work with a laser oscillator 22a in block D2; a laser detection system comprising a laser oscillator 23a in block D3 and a laser detector 23b to work with a laser oscillator 23a in block D4; a laser detection system comprising a laser oscillator 26a in block E1 and a laser detector 26b to work with a laser oscillator 26a in block E2; a laser detection system comprising a laser oscillator 27a in block E3 and a laser detector 27b to work with a laser oscillator 27a in block E4; a laser detection system comprising a laser oscillator 30a in block F1 and a laser detector 30b to work with a laser oscillator 30a in block F2; a laser detection system comprising a laser oscillator 31a in block F3 and a laser detector 31b to work with a laser oscillator 31a in block F4. In a similar manner, a laser detection system comprising a laser oscillator 24a in block D1 and a laser detector 24b to work with a laser oscillator 24a in block D3; a laser detection system comprising a laser oscillator 25a in block D2 and a laser detector 25b to work with a laser oscillator 25a in block D4; a laser detection system comprising a laser oscillator 28a in block E1 and a laser detector 28b to work with a laser oscillator 28a in block E3; a laser detection system comprising a laser oscillator 29a in block E2 and a laser detector 29b to work with a laser oscillator 29a in block E4; a laser detection system comprising a laser oscillator 32a in block F1 and a laser detector 32b to work with a laser oscillator 32a in block F3; a laser detection system comprising a laser oscillator 33a in block F2 and a laser detector 33b to work with a laser oscillator 33a in block F4.

The transport system operates as follows. The substrate wafers which have been transported through the mainline 46 may proceed along any one of the following routes to receive an identical processing: A1-A2-B1-B2-D1-process chamber34-D2-B3-C3-C2-C1-A3-A4; or A1-A2-B1-B2-B3-B4-B5-E1-process chamber 38-E2-B6-C6-C5-C4-C3-C2-C1-A3-A4; or A1-A2-B1-B2-B3-B4-B5-B6-B7-B8-B9-C9-F4-process chamber 44-F3-C8-C7-C6-C5-C4-C3-C2-C1-A3-A4.

Assume, for example, that the planned substrate routing was A1-A2-B1-B2-D1-process chamber 34-D2-B3-C3-C2-C1-A3-A4, when the laser detection system comprising laser oscillator 20a and laser detector 20b or that comprising laser oscillator 22a and laser detector 22b indicated a high contamination readings, the substrate routing may be switched to, for example, A1-A2-A3-C1-C2-C3-D4-process chamber 36-D3-C2-C1-A3-A4.

Other examples may include a case of switching the process chambers, such that a planned process chamber 40 may be switched to another process chamber when the laser detection system comprising the laser oscillator 27a and laser detector 27b detects high contaminations.

When the laser detection system comprising the laser oscillator 20a and the laser detector 20b indicates high contaminations as well as that comprising the laser oscillator 24a and the laser detector 24b, it can be recognized that block B2 has high contaminations. Therefore, the substrate routing should be chosen such that this block B2 is avoided. Accordingly, by placing several units of laser detection system in the transport system, detection of contaminations need not be limited to line configurations but can be carried out in specific local regional configurations.

According to the present transport system, because local regions of high contaminations can be detected, it is possible to operate continually without either shutting down the transport system or having the work waiting to be processed, by choosing a routing so as to avoid the contaminated regions.

The system can be made more flexible by having isolation shutters for blocking off each block as the occasion demanded so that by isolating the highly contaminated regions from other clean regions within the tunnel space, intrusion of contaminations into the clean regions can be prevented, thus minimizing any potential damage to the operation and facilitating the resumption of activities.

Also, the present transport system allows a plurality of units of laser detection system to be distributed suitably In the tunnel space, so that special emphasis can be placed on those regions which are prone to contamination by placing more units in those regions. Also, so long as window sections are pre-installed in the tunnel, the detector units may be moved from one window section to another window section of a problem region.

Figure 7:
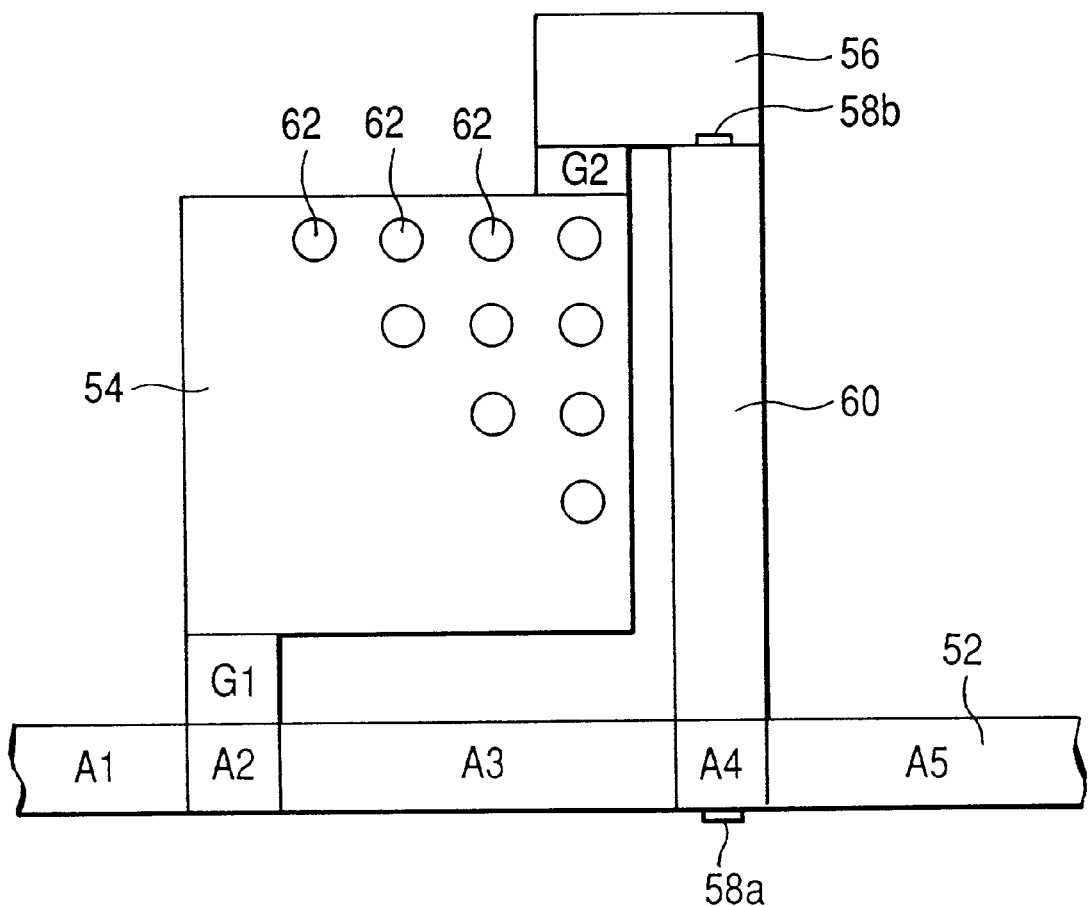
FIG. 7 is another example of the configuration of the transport route.

In the transport system shown in FIG. 7, mainline 52 and process chamber 56 are communicated with a subline 60 which is provided with a laser detection system comprising a laser oscillator 58a and a laser detector 58b at an end section of the subline 60. Further, the transport system in this embodiment is provided with a stockyard 54 for storing many substrate wafers 62, and the stockyard 54 is joined with the mainline 52 in block G1, and the stockyard 54 is joined with the process chamber 56 in block G2.

In this transport system, the wafers 62 are normally routed through the sequence A1-A2-A3-A4-subline 60-process chamber 56-subline 60-A4-A5. If the laser detection system having a laser oscillator 58a and laser detector 58b detects high contaminations in subline 60, the wafers 62 are re-routed to A1-A2-G1-stockyard 54, and until the problems in subline 60 are corrected, the wafers 62 are successively forwarded to and stored in the stockyard 54. When the problems in subline 60 have been resolved, the wafers 62 are transported through block G2 to process chamber 56, from where the wafers 62 which have been processed in process chamber 56 are returned to the mainline 52 from subline 60 to be forwarded to another process chamber.

As can be seen in the above embodiment, even if there is only one process chamber, by providing a stockyard 54, it is possible to avoid shutting down the entire system including the mainline 52.

Even if a local region of the system experiences an accident, there is no need for shutting down the entire system, so potential losses can be minimized.

An embodiment of control methodology related to the present substrate transport system is to incorporate a cleaning chamber prior to entering one of the process chambers so that, depending on the contamination data inside the tunnel space, appropriate cleaning step can be carried out. An example will be presented with reference to FIG. 8.

Figure 8:
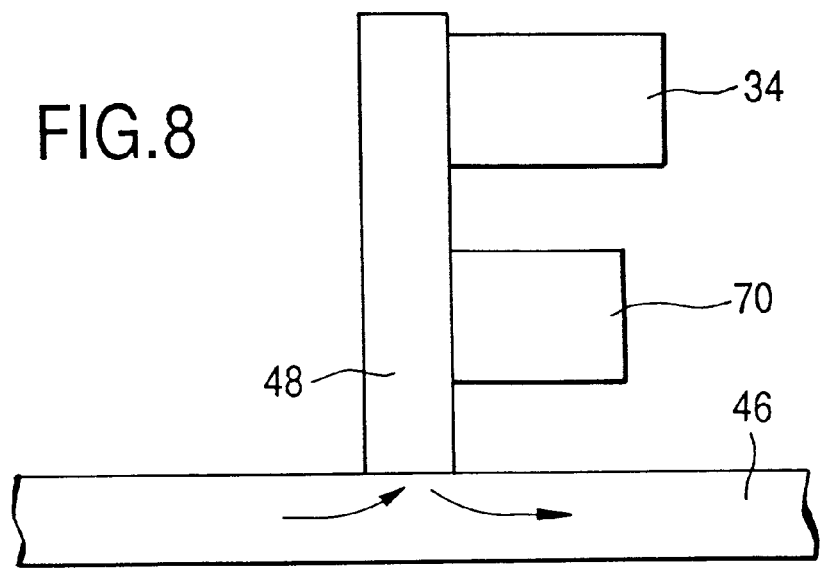
FIG. 8 is an illustration of an arrangement of a process chamber and a cleaning chamber.

The system shown in FIG. 8 includes a mainline 46 and a subline 48 which is provided with a process chamber 34 to perform film deposition process, for example. In the forestage of the process chamber 34, a cleaning chamber 70 for cleaning the substrate wafer with a cleansing process such as plasma ion cleaning.

The operation of such a system is as follows. The substrate wafers which have been transported on the mainline 46 enter into subline 48. A laser detection system disposed on the mainline 46 is used to measure the contamination level in the tunnel space. If the contamination level is small enough to be neglected, the wafers are allowed enter into the process chamber 34 to be processed, the wafers are directly transported to the process chamber 34 and prescribed process such as a film deposition is carried out at the process chamber 34. The processed wafers are transported from subline 48 to mainline 46 to be forwarded to other process chambers.

On the other hand, if the contamination level in the tunnel space is high, and the wafers cannot be processed in their current state, then, contaminated wafers which have been transported into the subline 48 from the mainline 46 are first placed into the cleaning chamber 70. After the wafers have been cleaned with some cleaning process in the cleaning chamber 70, the wafers are allowed to enter into the process chamber 34 to be processed, thence the wafers are transported to other process chambers. Therefore, only those wafers which are contaminated are routed to cleaning chamber 70 before entering into the process chamber 34.

According to this transport system, uncontaminated wafers not requiring cleaning are directly placed into process chamber 34, so only clean wafers are placed into the process chamber 34 to be processed by an appropriate process. Also, uncontaminated substrate wafers are not subjected to the cleaning process thus saving these wafers from receiving unnecessary cleaning and possible damages to the surface.

Another embodiment of the transport system is to control modes of cleaning depending on the level of contamination in the tunnel space.

The operation in this system can also be explained with reference to FIG. 8. In this case, all the wafers from the gas tunnel (mainline 46) are moved into the subline 48 and into the cleaning chamber 70, and after the cleaning process has been completed, the wafers are forwarded to other process chambers. If the contamination level is low and only a small amount of contaminations are adhering to the surface, a simple cleaning process or low energy process is applied to the wafers, while, if the contamination level is high (for example, the moisture level is high), there is good probability that native oxide growth has taken place on the surface, which means that a sufficiently strong cleaning process or prolonged cleaning duration should be applied to the wafers so that such native oxide films can be removed. After having thoroughly cleaned the surfaces, the wafers are allowed to enter into the process chamber 34.

According to this transport system, appropriate cleaning process is always applied to the wafers depending on the level of contamination so that the wafers entering into the process chamber 34 are not only always ready-to-be-processed, but also prevented from receiving surface damage caused by the unnecessarily harsh cleaning process.

Also, more than one cleaning chamber can be provided so that in addition to providing the appropriate level of cleaning to the wafers, different ability or types of cleaning can be given to the wafers, for example, a cleaning chamber specific to adsorbed water removal, a cleaning chamber specific to native oxide film, or a cleaning chamber specific to organic contaminations so that, depending on the type of contaminations, the wafers may be directed to any appropriate cleaning chamber.

As far as the moisture level inside the gas tunnel is concerned, a partial pressure of water may be selected as an indicator to adjust the conditions in the tunnel space, and in such a case, it is desirable to maintain the partial pressure of water at less than 0.1 Pa. By maintaining the partial pressure to be less than 0.1 Pa, the growth of native oxide film on the substrate surface can be controlled.

If the flow rate of the clean inert gas or oxygen flowing inside the tunnel space is too low, there is a danger of increasing the contamination level inside the tunnel space. Because the level of contaminations, specially moisture, is often caused by moisture leaving the inner walls of the gas tunnel, it is possible to lower the partial pressure of moisture by increasing the flow rate. However, if the flow rate is constantly set at a rate far above the level required to transport the substrate wafers, although the partial pressure of water can be kept low, other problems such as treatment of spent gas and load on the compressor for sending the gas through the system are increased, and undesirable extra costs are apt to be incurred. Therefore, by controlling the flow rates of inert gas and oxygen in accordance with the level of moisture in the tunnel space determined by partial pressure measurements, one or both flow rates for the inert gas and oxygen can be suitably controlled to prevent increase in the partial pressure of water, thus preventing adsorption of moisture on the wafers as well as excessive use of inert gas or oxygen so that the system operation becomes cost effective.

Conventional approach to determining the presence of native oxide film on the wafer surface is to use X-ray photoelectron spectroscopy (XPS). However, to use XPS analysis, the wafers must be placed in an ultra-high vacuum environment, and analysis productivity was very low. If a number of XPS devices are used to improve the productivity, the initial capital cost becomes too high to be practical.

Native oxide film is produced under the coexistence of water and oxygen. So, for a given set of tunnel conditions, such as the oxygen level and the temperature of the environment, the presence or absence of native oxide film, for a given type of substrate material, is determined uniquely by the magnitude of the partial pressure of water in the tunnel environment, to which the wafer surface is exposed, as well as by the duration of exposure at that partial pressure. Therefore, by measuring the water partial pressure to which the wafers have been exposed and the travel time in the tunnel space, it is possible to judge whether native oxide film on the wafer surface is present or not.

The type of substrate material is accurately known on the basis of information from the prior process chambers, and the exposure time and travel time at a water partial pressure in the tunnel space can also accurately be determined by instruments so that not only the possible presence of native oxide film but its thickness can be precisely determined.

Therefore, it is desirable that, similar to the previous cases of choosing to cleans the wafers in a cleaning chamber or selecting an appropriate cleaning process according to the data for contamination level, the wafers are cleaned depending on the presence or absence of native oxide film.

For example, with reference to FIG. 8 again, a laser detection system and a pressure gauge are provided in the mainline 46 to measure the water partial pressure in the gas tunnel. If the water partial pressure is sufficiently low to present no problem such that the wafers can be processed directly, the wafers entering into the subline 48 are loaded directly into the process chamber 34 to receive a certain processing therein, and the processed wafers are transported again from the subline 48 to the mainline 46 to be forwarded to other process chambers.

When the water partial pressure is somewhat high, the wafers are transported into the cleaning chamber 70, through the subline 48 from the mainline 46, and after the wafers have been cleaned into the cleaning chamber 70, they are processed in the process chamber 34 to be transported to other process chambers. In this case, if the partial pressure is less than 0.1 Pa, moisture adsorbed on the wafer surface exits as water, therefore, a low-energy cleaning process is used to lightly clean the surface. On the other hand, if it is judged that a native oxide film is present, then an energy sufficiently high to enable removal of the film is used, and the cleaned wafers are then allowed to enter into the process chamber 34. The transport system described above can accurately respond in an appropriate way to the need for cleaning, depending on the thermodynamic state of the adsorbed moisture whether it exists in a form of native oxide film or as simple water molecules. The wafers are not treated with unnecessarily harsh cleaning process to cause possible surface damage, so that processing are always applied to damage-free, sufficiently clean surfaces to avoid producing defective substrate.

In the following sections, various applications of the present transport system are demonstrated by embodiments.
[Embodiment 1]

Figure 1:
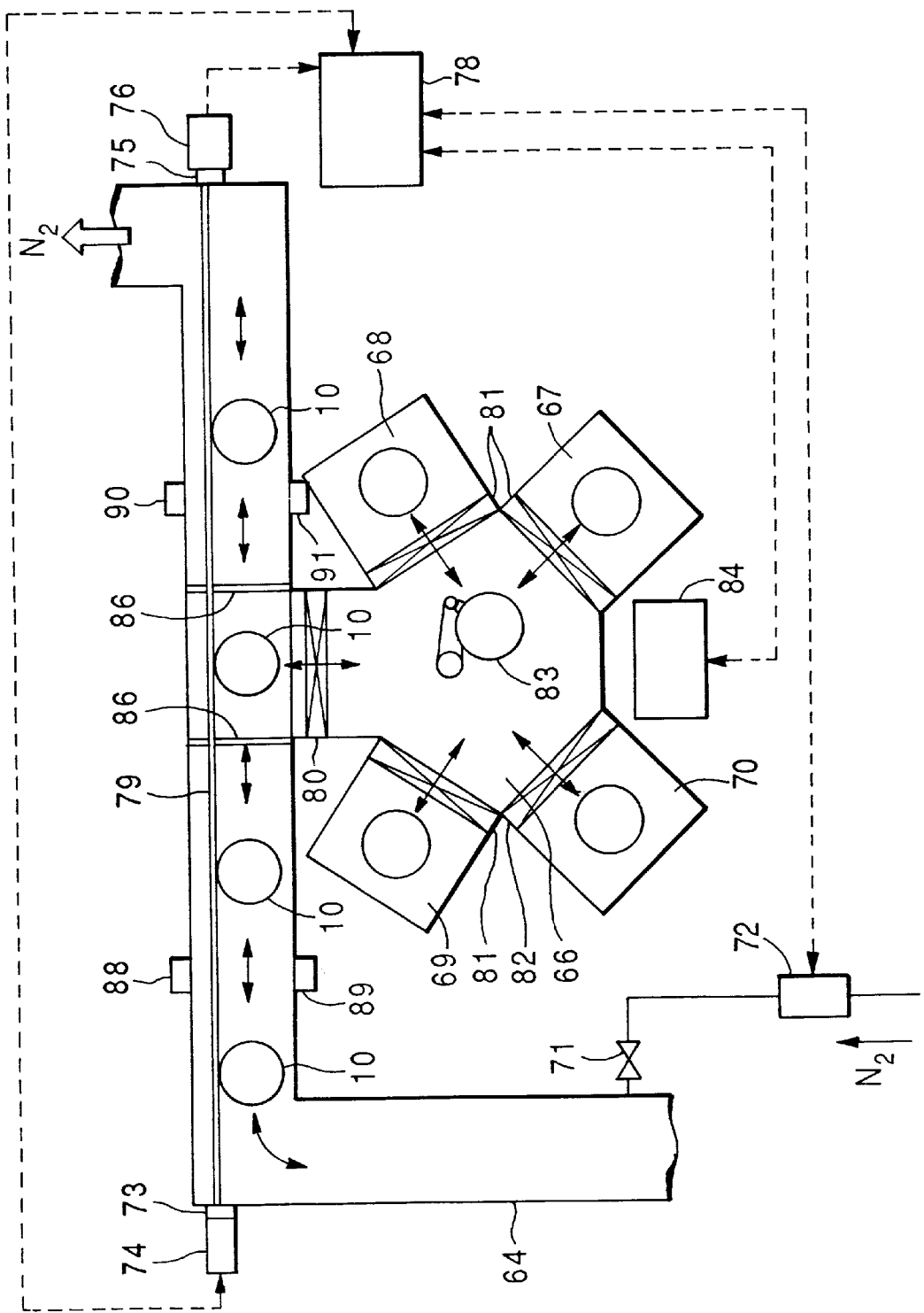
FIG. 1 is a schematic representation of an embodiment 1.

With reference to FIG. 1, a gas tunnel 64 for transporting the substrate wafers 10 is communicated with a transport chamber 66 having a process chamber 67, 68 and 69 and a cleaning chamber 70. The gas tunnel 64 has an inert gas entry device 72 which admits an inert gas, such as nitrogen, into the tunnel space 64 through a valve 71. The inert gas functions as a purge gas as well as a transport gas for moving the wafers 10.

The gas tunnel 64 has window section 73 for the laser oscillator 74, and a laser detector 76 to detect a laser beam 79 through a window section 75. The laser oscillator 74 and the laser detector 76 are connected to an spectrometer controller 78 to compute the contamination level inside the tunnel space 64 from the absorption spectral intensity measured.

The gas tunnel 64 is provided with a set of a scattered beam detector 88 and its reflector 89, and another set of scattered beam detector 90 and a reflector 91. They are also connected to the spectrometer controller and compute the concentrations of solid contaminations from the scatted beam intensity measured.

The transport chamber 66 is communicated with the gas tunnel 64 though a gate valve 80 and with process chambers 67, 68, 69 through a each gate valve 81, and with the cleaning chamber 70 through a gate valve 82. In this embodiment, three process chambers are provided to carry out different processes, but one or two process chambers or more than four process chambers can also be provided, depending on the need of the system. Similarly, only one cleaning chamber is shown but more than one cleaning chamber can be employed.

The transport chamber 66 is provided with a wafer distributor 83. The wafer distributor 83 is used to deliver or accept substrate wafers 10 between the various sites, such as between gas tunnel 64 and the transport chamber 66, or between the transport chamber 66 and the process chambers 67, 68, 69, or between the transport chamber 66 and the cleaning chamber 70.

The process chambers 67, 68 and 69 are used to provide a certain processing to the wafers 10, for example, CVD device and evaporation device used in thin film forming processes, diffusion furnace used for doping processes, and plasma etching device used for etching processes.

The cleaning chamber 70 is for cleaning the surfaces of wafers 10, and includes an ion cleaning device to bombard the surface with argon ions and a plasma cleaning device.

The operation of these component devices, such as wafer distributor 83, process chambers 67, 68 and 69 and cleaning chamber 70 is controlled by a process step controller 84.

It should be noted that, although only one transport chamber 66 is shown, several transport chambers 66 may be communicated with a line of gas tunnel 64. A plurality of transport chambers may be communicated in series.

The process step controller 84 is connected to the spectrometer controller 78, and the process step controller 84 controls the operation of chambers such as cleaning chamber 70 on the basis of contaminations data output from the spectrometer controller 78.

In the embodiment shown in FIG. 1, the spectrometer controller 78 is also connected to the inert gas entry device 72, which operates on the basis of the contaminations data output from the spectrometer controller 78.

Also, in the transport system shown in this embodiment, the pressure inside the gas tunnel 64 is higher than that in the transport chamber 66, therefore, there are provided isolation valves 86 to isolate the wafers 10 in the tunnel space 64, when the wafer distributor 83 is receiving the wafers 10 from the gas tunnel 64 into the transport chamber 66.

Also, if there are several process step controllers 84 to correspond with several transport chambers 66, one spectrometer controller 78 may be used to output data to these process step controllers 84, or if preferred, a number of spectrometer controllers 78 may be provided corresponding with each of the process step controllers 84.

In this embodiment of the transport system, the wafers which have been transported through the tunnel space 64 are stopped in front of the gate valve 80, and the isolation valves 86 isolate the wafers 10 from other wafers 10 in the tunnel space 64, and when the gate valve 80 is opened, the wafers 10 are placed inside the transport chamber 66 by means of the wafer distributor 83.

The wafer distributor 83 transfers the wafers 10 into the cleaning chamber 70, and the wafers 10 are cleaned therein.

At this time, the contaminations data regarding the environment inside the tunnel space 64 have already been transmitted from the laser detection system to the process step controller 84, and the cleaning chamber 70 cleans the wafer surface based on their data. That is, if the contamination level inside the tunnel space 64 is low, a low-energy cleaning process (e.g., less than 0.2 eV) is used so as not to impact damage to the surface. If the level of solid contaminations inside the tunnel space 64 is high, such that solid particles are suspected to be adhered to the wafer surface, the surface is irradiated with a high density ion while flowing an inert gas at a low temperature, or the surface is cleaned with pure water applied to the surface. If the contamination level appears to be even higher (e.g., higher than 0.1 ppm), cleaning is carried out at a higher energy level (e.g., 0.3–5 eV) sufficient to remove any native oxide film which may have formed on the wafer surface.

After having gone through the cleaning process appropriate to the level of contamination existing inside the tunnel space 64, the wafers 10 inside the cleaning chamber 70 are transferred, by means of the wafer distributor 83, into the process chamber 67 to provide a certain processing treatment, such as film deposition, to the wafers 10.

When the contamination level in the tunnel space 64 is sufficiently low that the wafers 10 are essentially uncontaminated, the transport routing may be switched so that, without going through the cleaning chamber 70, the wafers 10 may be directly loaded into the process chamber 67 by means of the wafer distributor 83.

After completion of the processing in the process chamber 67 and others, the wafers 10 are transferred again from the process chamber 67 and others to the gas tunnel 64 by means of the wafer distributor 83.

Also, in this embodiment, the contaminations data are also supplied to the inert gas entry device 72 so that, if the contamination level is high, the flow rate of inert gas is increased to lower the concentration of the contaminations in the tunnel space 64.

Accordingly, the combined action of lowering the contaminations level in the tunnel space 64 and cleaning process appropriate to the level of contamination of the surface, it is possible to provide an uninterrupted supply of substrate wafers of highly controlled cleanliness to the process chambers.

When the contamination level is high, and tenacious native oxide film has been formed on the surface, then nitrogen gas containing about 1 v/o of gaseous HF may be introduced to facilitate removal of the oxide film. However, in such a case, the substrate surface can be terminated with fluorine molecules, and if this should happen, irradiating the surface with a radiation of wavelength less than 800 nm can desorb the fluorine from the surface.

In order to increase the service life of the gate valve 80 provided between the tunnel 64 and the transport chamber 66 or to prevent production of contaminations due to wear of the gate valve 80, it is preferable that the pressures inside the tunnel space 64 and the transport chamber 66 should be the same when the gate valve 80 is made to operate. Similarly, in order to increase the service life of the gate valve 81 provided between the the transport chamber 66 and each process chambers 67–69 or to prevent production of contaminations due to wear of the gate valve 81, it is preferable that the pressures inside the process chambers 67–69 and the transport chamber 66 be the same when the gate valve 81 is operated.

However, the normal pressure inside the gas tunnel is over 760 torr, and the pressures inside the process chambers 67–69 are less than 1 torr. So, a pressure regulator is provided in the transport chamber 66 so that, when the gate valve 80 is to be opened, the pressure inside the transport chamber 66 should be increased (760 torr) to equalize the pressures between the tunnel space 64 and the transport chamber 66, and when the gate valve 81 is to be opened, the pressure inside the transport chamber 66 should be lowered (1 torr) so as to equalize the pressures inside the process chambers 67–69 and the transport chamber 66.

In regulating the pressures, it may be considered to raise the pressures to 760 torr in the each process chambers 67–69 after the processing, instead of the transport chamber 66, has been completed, however, this is not desirable because the dust particles, which are byproducts produced during processing, fly about by the sudden rush of high pressure gas, causing undesirable effect of the dust particles adhering to the already processed wafers.

Regulation of pressures in the transport chamber 66 require a pressure regulating device which can handle a highspeed gas pumping and maintain high cleanliness. A suitable device is a two-stage arrangement of an oil-free Turbo Molecular Pump and a dry pump connected directly in series. To exhaust the transport chamber 66 quickly, a high exhaust capacity pump should be chosen.

Instead of providing a pressure regulating device in the transport chamber 66, it is more preferable to provide a pressure regulating device for exhausting the gas between the isolation valves 86.

In a system provided with such a pressure regulating device, when the wafers 10 are transported through the tunnel space 64 and arrive in front of the transport chamber 66, the isolation valves 86 are closed to isolate the wafers 10 inside the tunnel space 64. Then, the pressure regulating device is operated to reduce the pressure in the isolation space formed by the isolation valves 86. The pressure in the isolation space is reduce to less than 1 torr so that it is at the same pressure as that in the transport chamber 66.

After this step, the gate valve 80 is opened, and the wafers 10 are transported from the tunnel space 64 into the transport chamber 66, then to the cleaning chamber 70 or to the process chamber 67 to provide a specified processing.

After the completion of the processing step, the wafers 10 are transported from the transport chamber 66 to the tunnel space 64, and after the gate valve 80 is closed, the pressure in the isolation space bounded by the isolation valves 86 is increased, and the isolation valves 86 are opened and the wafers 10 are forwarded to other process chambers.

This arrangement has an advantage that the isolation space bounded by the isolation valves 86 is smaller than the transport chamber 66, that is, the space for regulating pressure is small, and it can be exhausted at a much faster rate and the processing productivity is increased.

It is also preferable to keep the entire tunnel space 64 at a same reduced pressure as that in the transport chamber 66. By equalizing the pressures in the tunnel space 64 and the transport chamber 66, the isolation valves 86 can be eliminated to make the system more simple.

By reducing the pressure in the entire tunnel space 64, the gaseous molecular stream speed is increased, thus enabling a small volume of transport gas to move the substrate wafers and allowing to reduce the flow rate of the transport gas needed for the gas tunnel 64. By reducing the pressure inside the tunnel space 64, the laser detection system can generate the contamination data as secondary differential signals rather than direct absorption signals by the contamination to provide more sensitive data.

[Embodiment 2]

Figure 2:
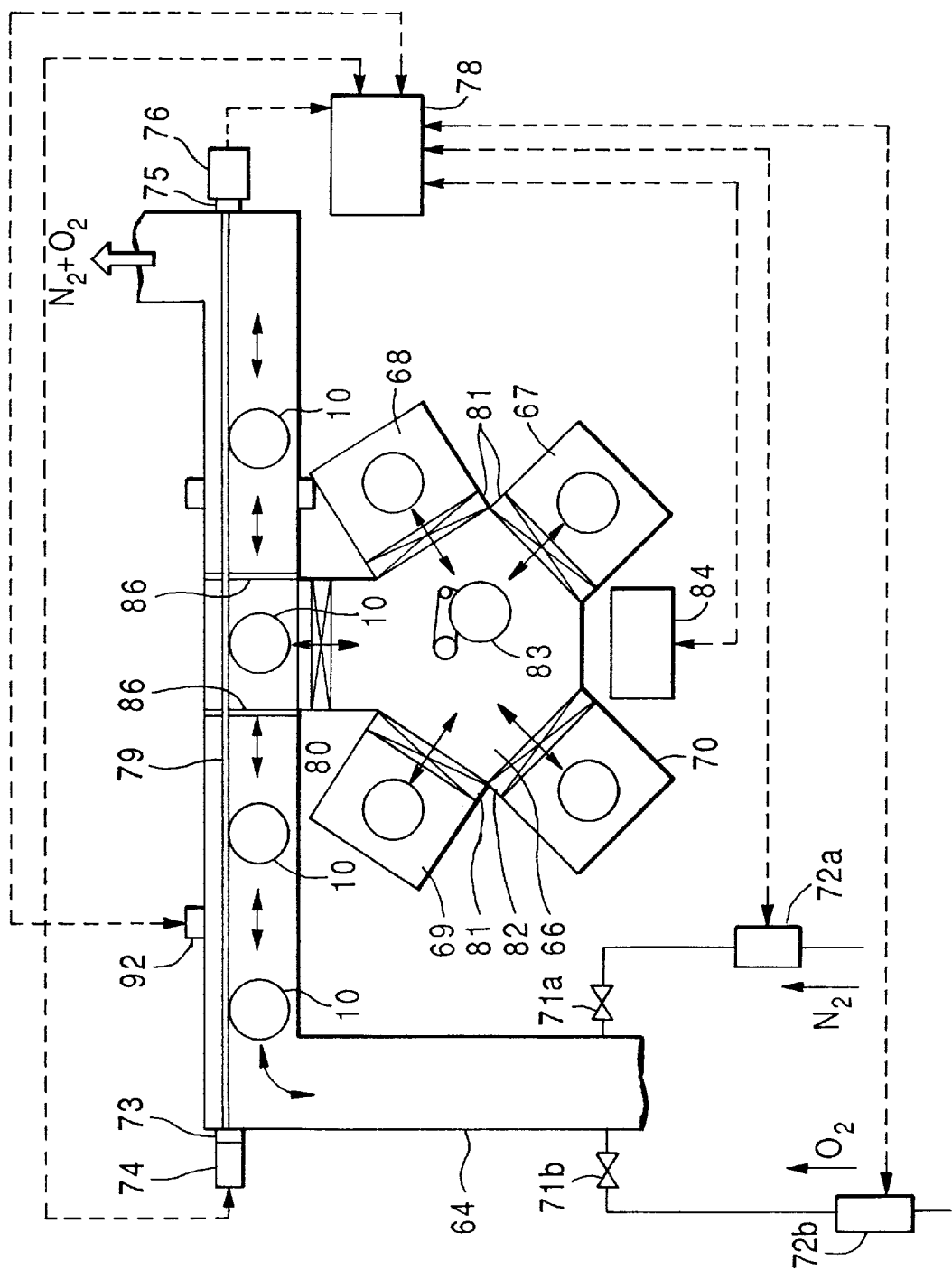
FIG. 2 is a schematic representation of an embodiment 2.

Embodiment 2 will be presented with reference to FIG. 2. Embodiment 2 is basically the same as Embodiment 1, except that an inert gas entry device 72*a* and an oxygen gas entry device 72b are provided for the gas tunnel 64 so that an inert gas, such as nitrogen, and oxygen gas can be admitted into the tunnel space 64 through the valves 71a and 71b. A laser oscillator 74 and a laser detector 76 provided in the gas tunnel 64 measure the intensity values of absorption spectra, and the spectrometer controller 78 computes the oxygen concentration inside the tunnel space 64.

The tunnel space 64 is instrumented with a pressure gauge 92 which is connected to the spectrometer controller 78 to computes a partial pressure of water inside the tunnel space 64. The spectrometer controller 78 is connected with the inert gas entry device 72a and the oxygen gas entry device 72b, and both the inert gas entry device 72a and the oxygen gas entry device 72b are controlled by the spectrometer controller 78, and are operated according to the output data from the controller 78 which limits their flow rates so as to keep the partial pressure of water at less than 0.1 Pa.

In this embodiment, the partial pressure data inside the tunnel space 64 are transmitted from the spectrometer controller 78 to the process step controller 84, and the cleaning chamber 70 cleans the surface of the wafers 10 on the basis of the output data. That is, when the partial pressure of water in the tunnel space 64 is less than 0.1 Pa, then cleaning process is carried out at a low-energy level, for example 0.2 eV so as not to impact damage to the wafers. On the other hand, if it is judged that native oxide film has been formed on the surface, an energy level sufficient to remove such films, for example, an energy range 0.3–5 eV is used, or cleaning with dilute hydrofluoric acid and pure water wash is used.

In this embodiment, the contaminations data, such as partial pressure of water, are supplied to the inert gas entry device 72a and the oxygen gas entry device 72b, so that, when the contamination level is high, the flow rates of inert gas and oxygen are increased to reduce the contaminations level inside the tunnel space 64. Thus, by combining the actions of reducing the contamination level inside the tunnel space 64 with the cleaning process adapted to the contamination level, a highly precise degree of cleanliness can be maintained on the wafer surface, so the processing can be carried out under stable conditions, and also the use of both inert gas and oxygen in the gas tunnel 64 allows reduction in the capital cost and peripheral facilities cost for dealing with the problems associated with oxygen deficient environment.

[Embodiment 3]

Figure 9:
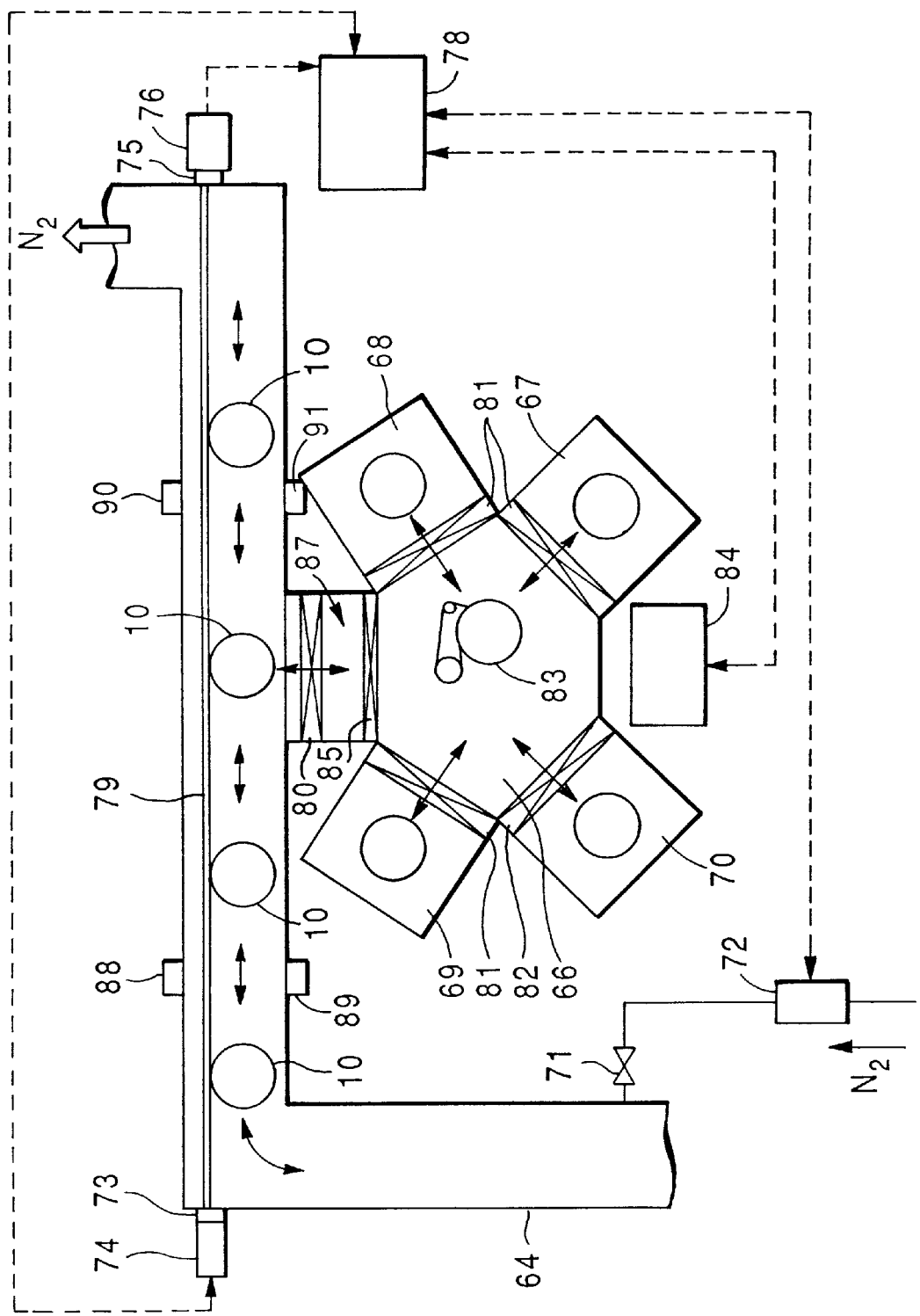
FIG. 9 is a schematic representation of an embodiment 3.

Embodiment 3 will be presented with reference to FIG. 9. Embodiment 3 is essentially the same as Embodiment 1, except that, in addition to the gate valve 80, another gate valve 85 is provided between the gas tunnel 64 and the transport chamber 66, and a moderator chamber 87 is provided between the gate valve 80 and the gate valve 85.

In the moderator chamber 87, a pressure regulator device (not shown) is provided so that the pressure inside the chamber may be freely regulated.

In the case of a transport system having such a moderator chamber 87, the wafers 10, which have been transported through the tunnel space 64 at a pressure of 760 torr, are placed in the moderator chamber 87 which is maintained at a pressure of 760 torr, and the gate valve 80 is closed. Then, the pressure regulator device is operated to reduce the pressure inside the moderator chamber 87 so that its pressure is the same as that in the transport chamber 66. When the pressures are equalized, the gate valve 85 is opened, and the wafers 10 are transported out of the moderator chamber 87 into the transport chamber 66 to provide a suitable processing to the wafers 10.

The processed wafers 10 are moved out of the transport chamber 66 and returned to the moderator chamber 87, and after the gate valve 85 has been closed, the pressure inside the moderator chamber 87 is restored to 760 torr. Then, the gate valve 80 is opened, and the wafers 10 inside the moderator chamber 87 are transported to the gas tunnel 64.

Because the moderator chamber 87 is smaller than the transport chamber 66, pressure regulating process can be carried out much more quickly and reliably for the moderator chamber 87 than for a similar process for the transport chamber 66, and such a system has an another advantage that the throughput is increased.

Further, because the transport chamber 66 is disposed between the moderator chamber 87 and the process chambers 67–69, possibility of byproducts produced in the process chambers 67–69 to enter as far as the moderator chamber 87 has been minimized. Especially, because the transport chamber 66 is rarefied under a reduced pressure, the microparticles such as dust particles can easily fall to the floor and are effectively prevented from reaching the moderator chamber 87. Therefore, even if pressure regulation by exhausting or admitting inert gas is carried out rapidly, there is little danger of the dust particles to fly about.

[Variation in Growth of Native Oxide Films with Time]

The effects of moisture levels in the atmosphere to the surface of the substrate wafer were investigated.

Figure 10:
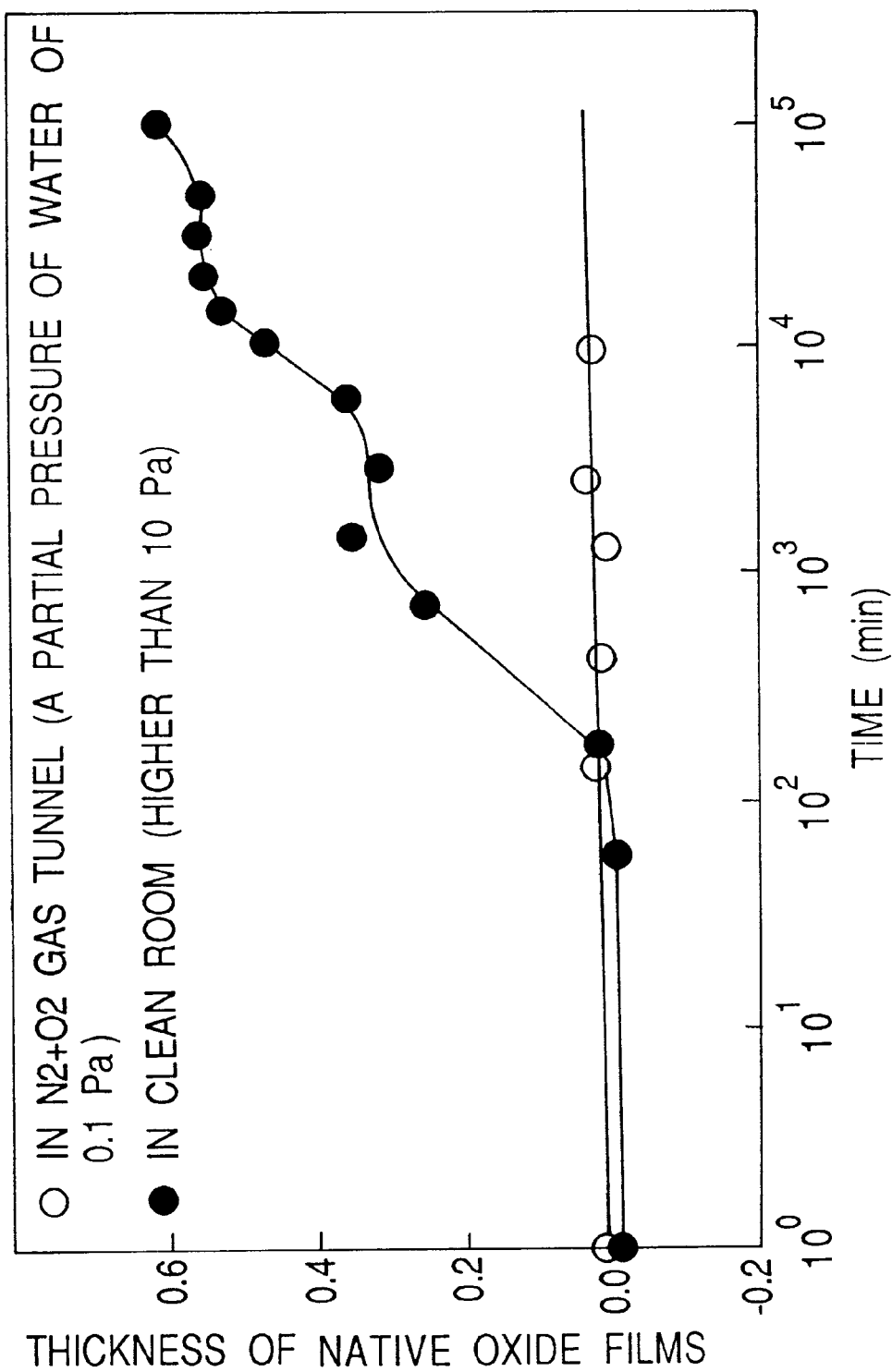
FIG. 10 is a graph showing a time-dependent nature of the growth of native oxide films.

The substrate material was an n-type, (100)-oriented silicon substrate material having a resistivity range of 2–4 $\Omega \cdot cm$. The substrate wafers were exposed to a clean room atmosphere containing a partial pressure of water of higher than 10 Pa, and to a gas tunnel atmosphere containing $N_2$ and $O_2$ at a partial pressure of water of 0.1 Pa. In each case, the growth of oxide film on the surface of the substrate wafer was studied as a function of the duration of exposure to the environment. The results are reported in FIG. 10.

When the wafers were exposed to an atmosphere at a partial pressure of water at higher than 10 Pa, water began to be adsorbed more than ten molecular layers onto the wafer surface immediately after the exposure, and oxygen from the environment began to be incorporated in the adsorbed film with passing of time. Although native oxide film was not formed immediately upon exposure, the oxidation process began after about 200 minutes and the film grew to a thickness of 0.3 nm after about 1,000 minutes. The thickness increased in steps with time, and after about 20,000 minutes, the film thickness reached 0.5 nm.

In comparison, for the wafers exposed to an atmosphere containing a partial pressure of water of 0.1 Pa in the tunnel space, moisture was adsorbed on the surface, but the film thickness is less than one molecular layer, and even after 10,000 minutes of exposure to the environment, there was no increase in the thickness of the adsorbed layer, and hardly any oxide layer was detected. It was observed that moisture adsorbed onto the surface existed as water molecules.

[Dependence of Adsorbed Water Volume on Water-partial-pressure]

The dependence of the volume of adsorbed water on the partial pressure of water was investigated for a number of substrate materials.

The substrate materials were prepared as a coating inside a stainless steel pipe of 4.35 mm inside diameter and 4 m in length. The materials for the coating were prepared in four forms: precipitated chromium oxide ($Cr_2O_3$); silicon deposited and oxidized to form silicon dioxide ($SiO_2$); electropolished (EP) surface; and precipitated magnetite ($Fe_3O_4$).

For testing the effects of partial pressures of water less than 0.15 Pa, after the moisture on the inside surface of the test material was removed completely by heating, argon gas stream containing a desired partial pressure of water is passed through from an entry end of the pipe, and the time span required to begin discharging argon containing some moisture was determined by monitoring the moisture content at the exit end of the pipe. When the moisture level in the flowing argon gas is low, for a short time span after flowing the gas, all the moisture in the gas is adsorbed onto the test material, and no water was detected in the exiting argon. After saturation of the surface adsorption on the test material, water in the argon gas began to be detected at the exit end of the pipe. Thus, by measuring the time span between the start of gas flow and the start of moisture detection, it was possible to compute the concentration of water adsorbed onto the test material corresponding to each partial pressure of water in argon gas passed through.

When the water partial pressure is higher than 10 Pa, a great quantity of water is immediately adsorbed onto the surface, and argon containing moisture is immediately detected at the exit end of the pipe. For this reason, it was not possible to apply this procedure to determine the adsorption concentration. Therefore, another procedure was adopted. In this procedure, after saturating the surface with adsorbed water by flowing an argon gas containing a desired level of moisture for sufficient duration, anhydrous hydrogen fluoride (HF) was passed through the pipe, and an equilibrium water adsorption level was computed by measuring the electrical resistivity of the resulting acid solution. Anhydrous HF is highly polarized and has a high solubility for water, so that by flowing this through the pipe, it is possible to remove all the adsorbed water from the interior surfaces. The electrical conductivity of HF responds to amount of dissolved water, therefore, by measuring the electrical conductivity of the acid solution, it was possible to compute the amount of water adsorbed onto the surface of the test material.

Figure 11:
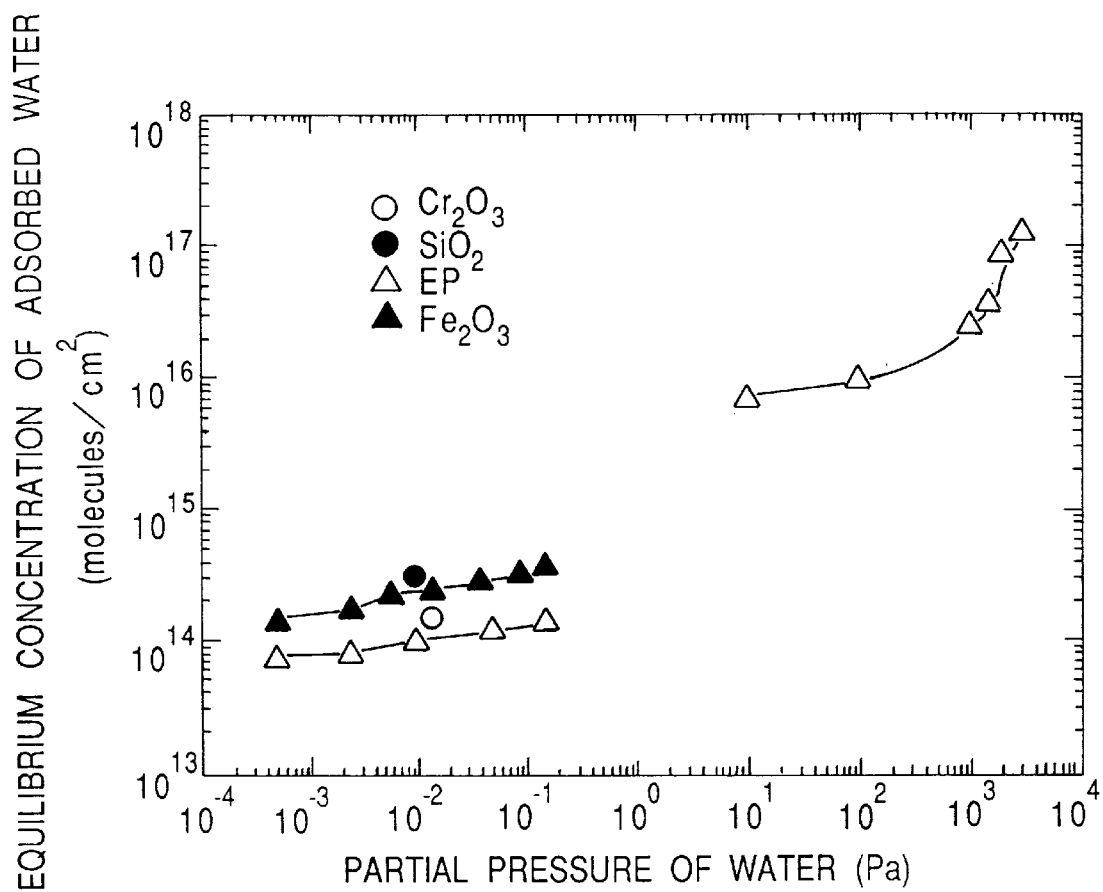
FIG. 11 is a graph showing a dependency of the concentration of adsorbed water on partial pressure of water.

The test results are reported in FIG. 11. It was found that, when the water partial pressure is higher than 10 Pa, there is no variation in adsorbed water level among the various materials, $Cr_2O_3$, $SiO_2$, EP, $Fe_2O_3$, indicating that the same amount of water was adsorbed on all the materials.

From the results shown in FIG. 11, it can be seen that, when the water partial pressure is less than 0.15 Pa, the concentration of adsorbed water is less than $3 \times 10^{14}$ molecules/cm$^2$. It is known that water molecules do not form a multilayer when its concentration is less than $1 \times 10^{15}$/cm$^2$, so, at the observed level of concentration, it can be deduced that multilayer adsorption did not take place in this concentration range. For monolayer adsorption, the degree of adsorption is governed by the activation energy of the adsorbing surface, so that the adsorbed amount is different for different materials. Therefore, when the water partial pressure is less than 0.15 Pa, it is also understood the adsorption configuration is monolayer.

The results in FIG. 11 further show that, in the range of partial pressure of water higher than 10 Pa, the adsorption concentration is higher than $7 \times 10^{15}$ molecules/cm$^2$, which is higher than a threshold value of $1 \times 10^{15}$ molecules/cm$^2$ for monolayer adsorption, indicating that adsorption occurs in a multilayer in these ranges. Also, the fact that adsorption concentrations are not dependent on the type of material is also an indication that the configuration is a multilayer adsorption.

It is known that monolayer adsorption does not promote the formation of native oxide film, but in multilayer adsorption, the water molecules begin to exist in clusters because of the effect of hydrogen bond, and the formation of native oxide film can take place. The results in FIG. 11 are consistent with this theory, showing that at the water partial pressure of 0.1 Pa or less, native oxide film formation is hardly observed.

[Adsorption of Organic Substances]

Tests were conducted to investigate the effects of adsorption of organic substances contained in the surrounding atmosphere to a surface of the substrate wafer.

Figure 12:
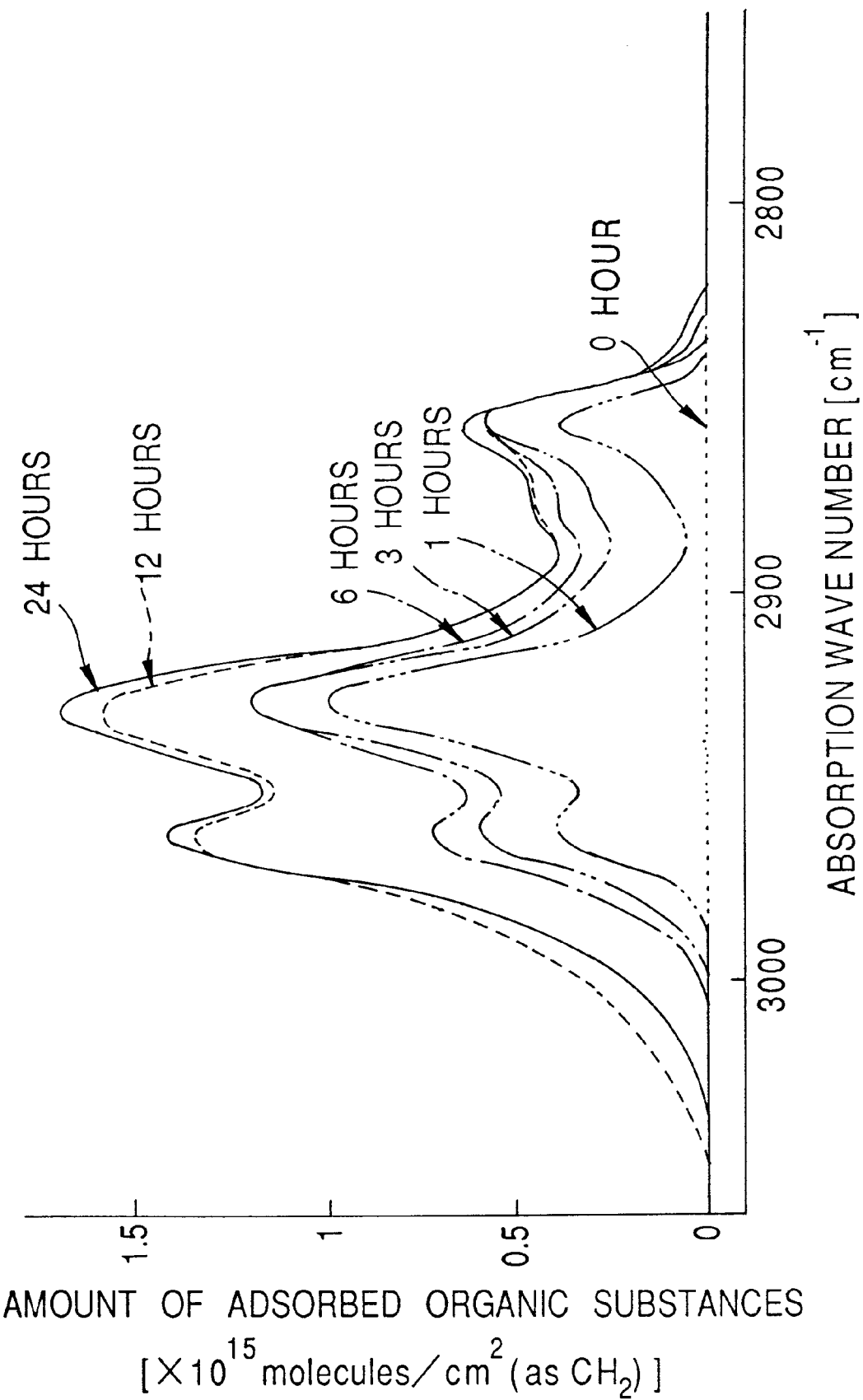
FIG. 12 is a graph showing the time dependent process of adsorption of organic contaminations in a clean room environment.

FIG. 12 shows the results of exposing silicon substrate wafers to a clean room atmosphere, by determining the time variation of the amount of adsorbed organic substances on the substrate wafers by Fourier Transform Infrared Analysis (FT-IR). The horizontal axis relates to absorption wave number and the vertical axis relates to the adsorbed amount.

Silicon substrate wafers which were cleaned of adsorbed organic substances by washing with ultra-pure water doped with ozone were used. Immediately after the washing step (0 hour), no adsorbed substance on the substrate wafers was observed, but with time of exposure in the clean room, it was seen that the quantity of adsorbed substances was increasing.

FIG. 13, on the other hand, compare the clean room exposure results performed above with the results of exposing the wafers, which had been cleaned in the same way, to the tunnel space atmosphere at a partial pressure of water at 0.1 Pa and flowing purge gas of a mixture of nitrogen and oxygen. In this environment, even after twenty four hours of exposure to the tunnel atmosphere, there is no adsorption of organic substances, because the tunnel environment is controlled by regulating the flow rates of purge gas, according to measured data of organic contaminations in the tunnel space, so as not to allow entry of organic contaminations into the tunnel space.

We claim:

1. A method for transporting substrate wafers from one process chamber to another process chamber through a gas tunnel, comprising the steps of:
   flowing a purge gas containing an inert gas or a gaseous mixture of an Inert gas and oxygen through said gas tunnel;
   measuring contamination levels within said gas tunnel with a semiconductor laser detection system; and
   adjusting transport parameters according to measured data.

2. A method according to claim 1, wherein said semiconductor laser detection system includes a laser oscillator for oscillating laser beams in a wavelength range of 0.75–2 μm for scanning contaminations so as to determine a concentration of a gaseous contaminants from spectral absorption data.

3. A method according to claim 1, wherein said semiconductor laser detection system determines a gaseous contamination level according to spectral absorption data of a laser beam oscillated by a laser oscillator, and a solid contamination level according to beam scattering data of said laser beam oscillated by said laser oscillator.

4. A method according to claim 3, wherein said semiconductor laser detection system identifies a gaseous contamination separately from a solid contamination by measuring an absorption spectrum intensity and a scattering spectrum intensity synchronously.

5. A method according to claim 1, wherein flow rates of said purge gas flowing in said gas tunnel is controlled in accordance with said measured data.

6. A method according to claim 1, wherein transport routing is controlled in accordance with said measured data.

7. A method according to claim 1, wherein a cleaning chamber is disposed in a fore-stage of a process chamber and said measured data are utilized to decide whether or not to place said substrate wafers in said cleaning chamber.

8. A method according to claim 1, wherein a cleaning chamber is disposed in a fore-stage of a process chamber and an operation of a cleaning chamber is controlled in accordance with said measured data.

9. A method according to claim 1, wherein said substrate wafers are transported by flowing of a transport gas which has common composition with a purge gas.

10. A method for transporting substrate wafers through a gas tunnel, comprising the step of:

flowing a purge gas containing a gaseous mixture of an inert gas and oxygen through said gas tunnel;

monitoring and measuring oxygen concentrations within a tunnel space with semiconductor laser detection system.

11. A method according to claim 10, wherein a flow rate of at least one of said inert gas or said oxygen is controlled in accordance with measured data generated by said semiconductor laser detection system.

12. A method according to claim 10, wherein a partial pressure of water within said tunnel space is not more than 0.1 Pa.

13. A method according to claim 10, wherein a need for substrate wafers cleaning is decided on a basis of adsorption of moisture or a presence or an absence of a native oxide film in accordance with a partial pressure of water inside a tunnel space.

* * * * *